United States Patent

Fujiwara

(10) Patent No.: US 8,654,308 B2
(45) Date of Patent: Feb. 18, 2014

(54) METHOD FOR DETERMINING EXPOSURE CONDITION, EXPOSURE METHOD, EXPOSURE APPARATUS, AND METHOD FOR MANUFACTURING DEVICE

(75) Inventor: Tomoharu Fujiwara, Ageo (JP)

(73) Assignee: Nikon Corporation, Tokyo (JP)

( * ) Notice: Subject to any disclaimer, the term of this patent is extended or adjusted under 35 U.S.C. 154(b) by 561 days.

(21) Appl. No.: 11/632,129

(22) PCT Filed: Jul. 11, 2005

(86) PCT No.: PCT/JP2005/012764
§ 371 (c)(1),
(2), (4) Date: Mar. 30, 2007

(87) PCT Pub. No.: WO2006/006562
PCT Pub. Date: Jan. 19, 2006

(65) Prior Publication Data
US 2007/0258070 A1    Nov. 8, 2007

(30) Foreign Application Priority Data

Jul. 12, 2004  (JP) .................................. 2004-205010

(51) Int. Cl.
  G03B 27/68 (2006.01)
  G03B 27/52 (2006.01)
  G03B 27/42 (2006.01)
  G03B 27/32 (2006.01)
  G03B 27/54 (2006.01)
  G03B 27/58 (2006.01)

(52) U.S. Cl.
  USPC ............... 355/52; 355/30; 355/53; 355/55; 355/67; 355/72; 355/77

(58) Field of Classification Search
  USPC ........... 355/30, 43, 67–74, 52, 53, 55, 60, 66, 355/77; 359/665; 250/492.1, 492.2, 492.22, 250/548; 430/5, 8, 22, 30, 311, 321, 312, 430/394
  See application file for complete search history.

(56) References Cited

U.S. PATENT DOCUMENTS 4,346,164 A   8/1982   Tabarelli et al.
4,480,910 A   11/1984  Takanashi et al.
(Continued)

FOREIGN PATENT DOCUMENTS

DE   221 563 A1   4/1985
DE   224 448 A1   7/1985
(Continued)

OTHER PUBLICATIONS

Jan. 16, 2007 International Preliminary Report on Patentability and Written Opinion of the International Search Authority for PCT/JP2005/012764 (with translation).

(Continued)

Primary Examiner — Toan Ton
Assistant Examiner — Christina Riddle
(74) Attorney, Agent, or Firm — Oliff PLC

(57) ABSTRACT

Pattern images are projected under various conditions of liquid prior to exposing a substrate, and exposure conditions for exposing a pattern image on the substrate is determined based on each projection condition of the pattern images. When a pattern image is projected through liquid, a substrate can be excellently exposed in a desired exposure condition according to the condition of the liquid.

16 Claims, 6 Drawing Sheets

(56) References Cited

U.S. PATENT DOCUMENTS

| | | | |
|---|---|---|---|
| 4,908,656 A * | 3/1990 | Suwa et al. | 355/53 |
| 5,610,683 A | 3/1997 | Takahashi | |
| 5,715,039 A | 2/1998 | Fukuda et al. | |
| 5,825,043 A | 10/1998 | Suwa | |
| 5,883,704 A * | 3/1999 | Nishi et al. | 355/67 |
| 6,187,488 B1 | 2/2001 | Hayasaki et al. | |
| 6,228,544 B1 | 5/2001 | Ota | |
| 6,235,438 B1 * | 5/2001 | Suzuki et al. | 430/30 |
| 6,304,317 B1 * | 10/2001 | Taniguchi et al. | 355/55 |
| 2001/0050761 A1 * | 12/2001 | Uzawa | 355/53 |
| 2002/0033934 A1 * | 3/2002 | Ishii | 355/30 |
| 2002/0167651 A1 * | 11/2002 | Boonman et al. | 355/67 |
| 2003/0215964 A1 | 11/2003 | Gau et al. | |
| 2004/0042094 A1 * | 3/2004 | Matsuyama | 359/822 |
| 2004/0165159 A1 | 8/2004 | Lof et al. | |
| 2005/0046813 A1 | 3/2005 | Streefkerk et al. | |
| 2005/0132914 A1 * | 6/2005 | Mulkens et al. | 101/463.1 |
| 2005/0146694 A1 * | 7/2005 | Tokita | 355/30 |
| 2005/0179877 A1 * | 8/2005 | Mulkens et al. | 355/30 |
| 2005/0219482 A1 * | 10/2005 | Baselmans et al. | 355/30 |
| 2005/0219489 A1 * | 10/2005 | Nei et al. | 355/53 |
| 2005/0259234 A1 * | 11/2005 | Hirukawa et al. | 355/53 |
| 2005/0264780 A1 | 12/2005 | Graeupner | |
| 2006/0072088 A1 * | 4/2006 | Lipson et al. | 355/53 |
| 2006/0082744 A1 * | 4/2006 | Hirukawa | 355/30 |
| 2006/0197930 A1 * | 9/2006 | Kawashima et al. | 355/55 |
| 2007/0195299 A1 | 8/2007 | Graeupner | |

FOREIGN PATENT DOCUMENTS

| | | |
|---|---|---|
| JP | A 58-202448 | 11/1983 |
| JP | A 59-19912 | 2/1984 |
| JP | A 62-65326 | 3/1987 |
| JP | A 63-157419 | 6/1988 |
| JP | A 4-305915 | 10/1992 |
| JP | A 4-305917 | 10/1992 |
| JP | A 5-62877 | 3/1993 |
| JP | A 6-124873 | 5/1994 |
| JP | A 7-220990 | 8/1995 |
| JP | A 8-316125 | 11/1996 |
| JP | 10303114 A * | 11/1998 ............ H01L 21/027 |
| JP | A 10-303114 | 11/1998 |
| JP | A 10-340846 | 12/1998 |
| JP | A 11-176727 | 7/1999 |
| JP | A 2000-58436 | 2/2000 |
| JP | A 2004-207521 | 7/2004 |
| JP | A 2005-12201 | 1/2005 |
| JP | A 2005-51231 | 2/2005 |
| JP | A 2005-116570 | 4/2005 |
| JP | A 2005-136404 | 5/2005 |
| TW | 449779 | 8/2001 |
| TW | 531822 | 5/2003 |
| TW | 559895 | 11/2003 |
| TW | 200400540 | 1/2004 |
| TW | 200409935 | 6/2004 |
| WO | WO 99/49504 A1 | 9/1999 |
| WO | WO 2004/019128 A2 | 3/2004 |
| WO | WO 2004/053596 A2 | 6/2004 |
| WO | WO 2004107417 A1 * | 12/2004 |

OTHER PUBLICATIONS

Nov. 8, 2005 International Search Report for PCT/JP2005/012764 (with translation).

Feb. 5, 2008 Supplemental European Search Report for European Patent Application No. 05758288.4.

Jun. 25, 2008 Office Action in European Patent Application No. 05 758 288.4.

Apr. 7, 2010 Office Action in European Patent Application No. 05 758 288.4.

Dec. 12, 2011 Office Action in European Patent Application No. 05 758 288.4.

Mar. 27, 2013 Office Action issued in Taiwanese Patent Application No. 094123485, w/human translation.

* cited by examiner

METHOD FOR DETERMINING EXPOSURE CONDITION, EXPOSURE METHOD, EXPOSURE APPARATUS, AND METHOD FOR MANUFACTURING DEVICE

TECHNICAL FIELD

The present invention relates to a method for determining an exposure condition to expose a substrate through a liquid, an exposure method, an exposure apparatus, and a method for manufacturing a device.

BACKGROUND ART

Semiconductor devices and liquid crystal display devices are manufacturing by means of the so-called photolithography technique in which a pattern formed on a mask is transferred onto a photosensitive substrate. The exposure apparatus, which is used in the photolithography step, includes a mask stage for supporting the mask and a substrate stage for supporting the substrate. The pattern on the mask is transferred onto the substrate via a projection optical system while successively moving the mask stage and the substrate stage. In recent years, it is demanded to realize the higher resolution of the projection optical system in order to respond to the further advance of the higher integration of the device pattern. The shorter the exposure wavelength to be used is, the higher the resolution of the projection optical system is. The larger the numerical aperture of the projection optical system is, the higher the resolution of the projection optical system is. Therefore, the exposure wavelength, which is used for the exposure apparatus, is shortened year by year, and the numerical aperture of the projection optical system is increased as well. The exposure wavelength, which is dominantly used at present, is 248 nm of the KrF excimer laser. However, the exposure wavelength of 193 nm of the ArF excimer laser, which is shorter than the above, is also practically used in some situations. When the exposure is performed, the depth of focus (DOF) is also important in the same manner as the resolution. The resolution R and the depth of focus δ are represented by the following expressions respectively.

$$R = k_1 \cdot \lambda / NA \quad (1)$$

$$\delta = \pm k_2 \cdot \lambda / NA^2 \quad (2)$$

In the expressions, $\lambda$ represents the exposure wavelength, NA represents the numerical aperture of the projection optical system, and $k_1$ and $k_2$ represent the process coefficients. According to the expressions (1) and (2), the following fact is appreciated. That is, when the exposure wavelength $\lambda$ is shortened and the numerical aperture NA is increased in order to enhance the resolution R, then the depth of focus δ is narrowed.

If the depth of focus δ is too narrowed, it is difficult to match the substrate surface with respect to the image plane of the projection optical system. It is feared that the focus margin is insufficient during the exposure operation. Accordingly, the liquid immersion method has been suggested, which is disclosed, for example, in International Publication No. 99/49504 as a method for substantially shortening the exposure wavelength and widening the depth of focus. In this liquid immersion method, the space between the lower surface of the projection optical system and the substrate surface is filled with a liquid such as water or any organic solvent to form a liquid immersion area so that the resolution is improved and the depth of focus is magnified about n times by utilizing the fact that the wavelength of the exposure light beam in the liquid is 1/n as compared with that in the air (n represents the refractive index of the liquid, which is about 1.2 to 1.6 in ordinary cases).

DISCLOSURE OF THE INVENTION

Task to Be Solved by the Invention

When the substrate is subjected to the exposure by means of the liquid immersion method, the condition of the liquid (for example, the temperature) is one of fluctuation factors of the exposure condition. Therefore, when the pattern image is practically projected onto the substrate via the projection optical system and the liquid, it is conceived to adopt such a procedure that the condition of the liquid is measured with a measuring instrument, and the condition of the liquid is adjusted on the basis of an obtained measurement result so that a desired projection state is obtained. However, if the measured value obtained by the measuring instrument involves any error, there is such a possibility that any desired projection state is not obtained, and the exposure accuracy is deteriorated, when the apparatus is corrected on the basis of the measured value. In particular, the state of the liquid (fluid) is dynamic. It is not easy to measure the condition of the liquid highly accurately with high response performance.

The present invention has been made taking the foregoing circumstances into consideration, an object of which is to provide a method for determining an exposure condition which makes it possible to satisfactorily expose a substrate through a liquid, an exposure method for exposing the substrate under the exposure condition determined by the method, and a method for producing a device based on the use of the exposure method. Another object of the present invention is to provide a method for determining an exposure condition which makes it possible to expose a substrate in a desired projection state when a pattern image is projected via a projection optical system and a liquid, an exposure method for exposing the substrate under the exposure condition determined by the method, and a method for producing a device based on the use of the exposure method. Still another object of the present invention is to provide an exposure apparatus which makes it possible to expose a substrate in a desired projection state when the substrate is exposed through a liquid, and a method for producing a device based on the use of the exposure apparatus.

SOLUTION FOR THE TASK

In order to achieve the objects as described above, the present invention adopts the following constructions.

According to a first aspect of the present invention, there is provided a method for determining an exposure condition to expose a substrate by projecting a pattern image onto the substrate via a projection optical system and a liquid; the method for determining the exposure condition comprising successively projecting the pattern image via the projection optical system under a plurality of conditions of the liquid before exposing the substrate; and determining the exposure condition to be used when the pattern image is projected onto the substrate, on the basis of projection states of the pattern image.

According to the method for determining the exposure condition of the present invention, the pattern image is actually projected via the projection optical system and the liquid while changing the condition of the liquid, and the exposure condition, which is to be used when the pattern image is projected onto the substrate, is determined on the basis of the projection state. Therefore, it is possible to determine the optimum exposure condition on the basis of the actual projection state.

According to a second aspect of the present invention, there is provided a method for determining an exposure condition to expose a substrate by radiating an exposure light beam onto the substrate through a liquid; the method for determining the exposure condition comprising radiating the exposure light beam onto a test substrate through the liquid under a plurality of conditions of the liquid to expose the test substrate before exposing the substrate; and determining the exposure condition to be used when the substrate is exposed, depending on exposure states of the test substrate. According to the method for determining the exposure condition of the present invention, the test substrate is actually exposed through the liquid while changing the condition of the liquid, and the exposure condition, which is to be used when the substrate is actually exposed, is determined depending on the exposure state. Therefore, it is possible to determine the optimum exposure condition.

According to a third aspect of the present invention, there is provided an exposure method comprising exposing a substrate under an exposure condition determined by the method for determining the exposure condition of the present invention. According to the exposure method of the present invention, it is possible to expose the substrate under the optimum exposure condition. Therefore, the substrate can be exposed satisfactorily.

According to the present invention, there is provided a method for producing a device, comprising using the exposure method of the present invention. According to the method for producing the device of the present invention, the substrate can be exposed satisfactorily, and it is possible to provide the device having desired performance.

According to a fourth aspect of the present invention, there is provided an exposure apparatus for exposing a substrate through a liquid; the exposure apparatus comprising a projection optical system which projects a pattern image onto the substrate through the liquid; a liquid immersion mechanism which forms a liquid immersion area on an image plane side of the projection optical system; and a measuring unit which measures projection states of the pattern image successively projected under a plurality of conditions of the liquid for forming the liquid immersion area before exposing the substrate.

According to the exposure apparatus of the present invention, the measuring unit is provided, which measures the projection state of the pattern image actually projected via the projection optical system and the liquid, while changing the condition of the liquid for forming the liquid immersion area. Therefore, the exposure condition, which is optimum when the pattern image is projected onto the substrate, can be determined on the basis of the measurement result.

According to a fifth aspect of the present invention, there is provided anexposure apparatus for exposing a substrate through a liquid; the exposure apparatus comprising a projection optical system which projects a pattern image onto the substrate through the liquid; and a control unit which determines an exposure condition on the basis of projection states of a pattern image projected by the projection optical system under a plurality of different conditions of the liquid and which executes exposure under the determined exposure condition.

In the liquid immersion exposure, the pattern image is projected onto the substrate through the liquid immersion area. Therefore, there is such a possibility that the projection state of the pattern image is affected by the state of the liquid immersion area and/or the physical quantity of the liquid itself for forming the liquid immersion area. According to the exposure apparatus of the present invention, the exposure condition, which is optimum in relation to the liquid, can be determined or selected by the control unit even in the case of the liquid immersion exposure, and it is possible to perform the exposure under the exposure condition determined as described above.

According to the present invention, there is provided a method for producing a device, comprising using the exposure apparatus according to the fourth or fifth aspect of the present invention. According to the method for producing the device of the present invention, the substrate can be exposed satisfactorily, and it is possible to provide the device having desired performance.

EFFECT OF THE INVENTION

According to the present invention, it is possible to determine the optimum exposure condition to be used when the pattern image is projected via the projection optical system and the liquid. Therefore, the substrate can be exposed satisfactorily under the determined exposure condition.

BEST MODE FOR CARRYING OUT THE INVENTION

Figure 1:
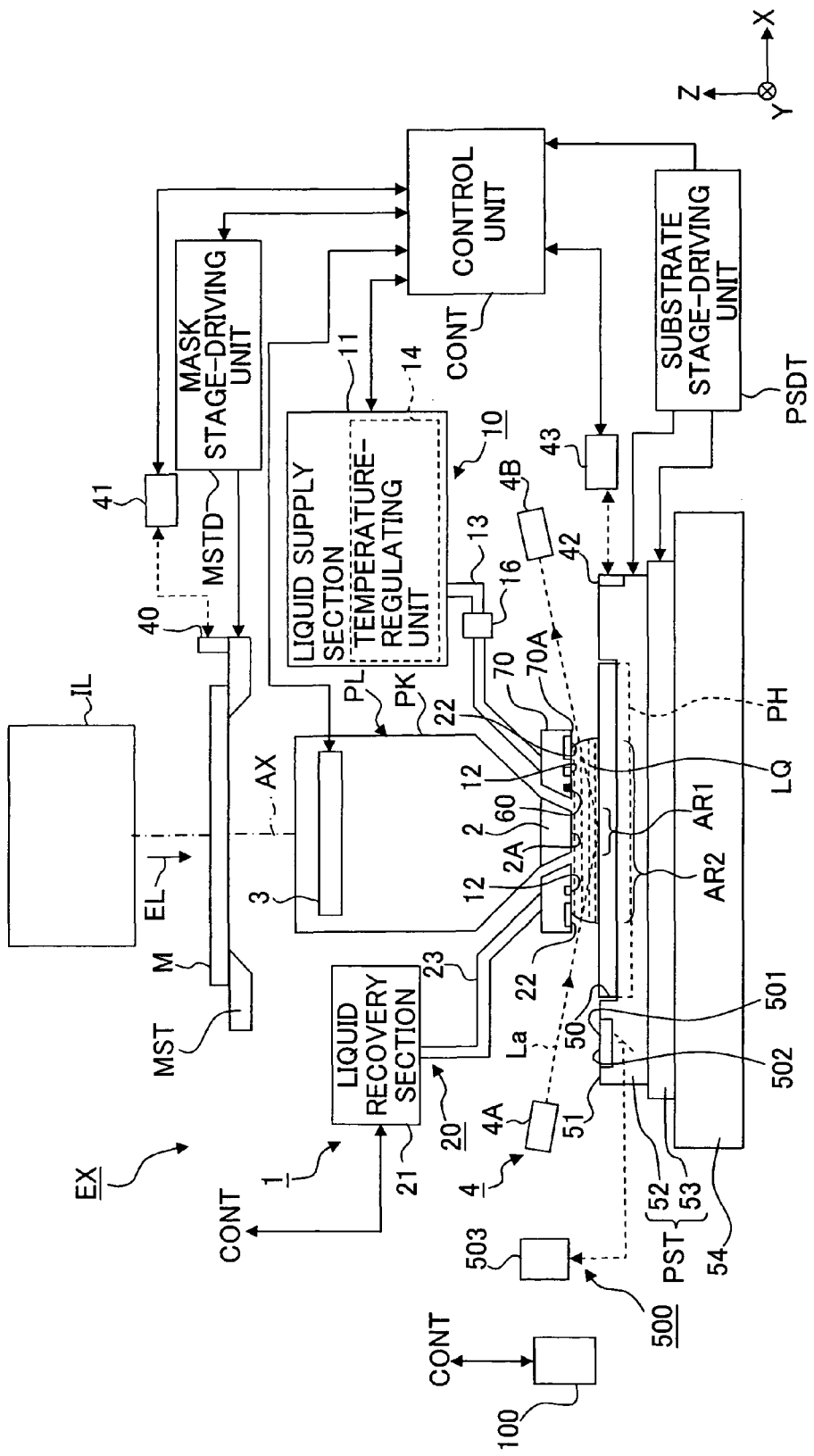
FIG. 1 shows a schematic arrangement illustrating an exposure apparatus according to an embodiment of the present invention.

Embodiments of the present invention will be explained below with reference to the drawings. FIG. 1 shows a schematic arrangement illustrating an embodiment of the exposure apparatus according to the present invention.

With reference to FIG. 1, the exposure apparatus EX comprises a mask stage MST which is movable while supporting a mask M, a substrate stage PST which has a substrate holder PH for supporting a substrate P and which is movable while supporting the substrate P on the substrate holder PH, an illumination optical system IL which illuminates, with an exposure light beam EL, the mask M supported by the mask stage MST, a projection optical system PL which projects an image of a pattern of the mask M illuminated with the exposure light beam EL onto the substrate P supported by the substrate stage PST, and a control unit CONT which integrally controls the operation of the entire exposure apparatus EX. A shape-measuring unit 100, which is capable of measuring the shape of the pattern (for example, the pattern line width) formed on the substrate P, provides a measurement result which is outputted to the control unit CONT. In this embodiment, a scanning electron microscope (SEM) is used as the shape-measuring unit 100. However, it is also possible to use a measuring unit based on any other system such as the electric resistance system. The shape-measuring unit 100 may be provided for the exposure apparatus. Alternatively, any unit, which is constructed as a member separately from the exposure apparatus, may be utilized therefor.

The exposure apparatus EX of this embodiment is a liquid immersion exposure apparatus to which the liquid immersion method is applied in order that the exposure wavelength is substantially shortened to improve the resolution and the depth of focus is substantially widened. The exposure apparatus EX comprises a liquid immersion mechanism 1 which forms a liquid immersion area AR2 of the liquid LQ on the image plane side of the projection optical system PL. The liquid immersion mechanism 1 includes a liquid supply mechanism 10 which supplies the liquid LQ to the image plane side of the projection optical system PL, and a liquid recovery mechanism 20 which recovers the liquid LQ on the substrate P. In this embodiment, pure water is used for the liquid LQ. The exposure apparatus EX forms the liquid immersion area AR2 locally on at least a part of the substrate P including a projection area AR1 of the projection optical system PL by the liquid LQ supplied from the liquid supply mechanism 10 at least during the period in which the pattern image of the mask M is transferred onto the substrate P, the liquid immersion area AR2 being larger than the projection area AR1 and smaller than the substrate P. Specifically, the exposure apparatus EX is operated as follows. That is, the space between the surface (exposure surface) of the substrate P and the optical element 2 disposed at the end portion on the image plane side of the projection optical system PL is filled with the liquid LQ to form the liquid immersion area AR2. The pattern image of the mask M is projected onto the substrate P to expose the substrate P therewith via the projection optical system PL and the liquid LQ disposed between the projection optical system PL and the substrate P.

A nozzle member 70, which constitutes a part of the liquid immersion mechanism 1, is arranged in the vicinity of the image plane of the projection optical system PL, specifically in the vicinity of the optical element 2 disposed at the end portion on the image plane side of the projection optical system PL. The nozzle member 70 is an annular member which is provided to surround the end portion of the projection optical system PL over the substrate P (substrate stage PST). The liquid immersion mechanism 1, which has the nozzle member 70 and other components, may have such a structure that the liquid immersion mechanism 1 is detachable with respect to the exposure apparatus so that the liquid immersion mechanism 1 may be installed to the exposure apparatus EX only when the liquid immersion exposure is performed. That is, it is allowable that the liquid immersion mechanism 1 is not provided fixedly to the exposure apparatus EX.

The embodiment of the present invention will now be explained as exemplified by a case of the use of the scanning type exposure apparatus (so-called scanning stepper) as the exposure apparatus EX in which the substrate P is exposed with the pattern formed on the mask M while synchronously moving the mask M and the substrate P in mutually different directions (opposite directions) in the scanning directions (predetermined directions). In the following explanation, the X axis direction resides in the synchronous movement direction (scanning direction, predetermined direction) for the mask M and the substrate P in the horizontal plane, the Y axis direction (non-scanning direction) resides in the direction which is perpendicular to the X axis direction in the horizontal plane, and the Z axis direction resides in the direction which is perpendicular to the X axis direction and the Y axis direction and which is coincident with the optical axis AX of the projection optical system PL. The directions of rotation (inclination) about the X axis, the Y axis, and the Z axis are designated as θX, θY, and θZ directions respectively. The term "substrate" referred to herein includes those obtained by coating a semiconductor wafer surface with a resist, and the term "mask" includes a reticle formed with a device pattern to be subjected to the reduction projection onto the substrate.

The illumination optical system IL is provided so that the mask M, which is supported on the mask stage MST, is illuminated with the exposure light beam EL. The illumination optical system IL includes, for example, an exposure light source, an optical integrator which uniformizes the illuminance of the light flux radiated from the exposure light source, a condenser lens which collects the exposure light beam EL supplied from the optical integrator, a relay lens system, and a movable blind which sets the illumination area on the mask M illuminated with the exposure light beam EL. The predetermined illumination area on the mask M is illuminated with the exposure light beam EL having a uniform illuminance distribution by means of the illumination optical system IL. Those usable as the exposure light beam EL radiated from the illumination optical system IL include, for example, emission lines (g-line, h-line, i-line) radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used. As described above, the liquid LQ is pure water in this embodiment, through which even the ArF excimer laser beam as the exposure light beam EL is transmissive. Those also capable of being transmitted through pure water include the emission line (g-line, h-line, i-line) and the far ultraviolet light beam (DUV light beam) such as the KrF excimer laser beam (wavelength: 248 nm).

The mask stage MST is movable while supporting the mask M. The mask stage MST is two-dimensionally movable in the plane perpendicular to the optical axis AX of the projection optical system PL, i.e., in the XY plane, and it is finely rotatable in the θZ direction. The mask stage MST is driven by a mask stage-driving unit MSTD such as a linear motor. The mask stage-driving unit MSTD is controlled by the control unit CONT. A movement mirror 40, which is movable together with the mask stage MST, is provided on the mask stage MST. A laser interferometer 41 is provided at a position opposed to the movement mirror 40. The position in the two-dimensional direction and the angle of rotation of the mask M on the mask stage MST are measured in real-time by the laser interferometer 41. The result of the measurement is outputted to the control unit CONT. The control unit CONT drives the mask stage-driving unit MSTD on the basis of the result of the measurement obtained by the laser interferometer 41 to thereby position the mask M supported on the mask stage MST.

The projection optical system PL projects the pattern on the mask M onto the substrate P at a predetermined projection magnification β to perform the exposure. The projection optical system PL comprises a plurality of optical elements including an optical element (lens) 2 provided at the end portion on the side of the substrate P. The optical elements are supported by a barrel PK.

The projection optical system PL is provided with an image formation characteristic control unit 3 which is capable of adjusting the image formation characteristic (optical characteristic) of the projection optical system PL, as disclosed, for example, in Japanese Patent Application Laid-open No. 60-78454, Japanese Patent Application Laid-open No. 11-195602 (corresponding to U.S. Pat. No. 6,235,438 B1), and International Publication No. 03/65428. The image formation characteristic control unit 3 includes an optical element-driving mechanism which is capable of moving a part or parts of the plurality of optical elements for constructing the projection optical system PL. The optical element-driving mechanism includes a plurality of extendable/contractible driving elements such as piezoelectric elements capable of being driven independently, the driving elements being disposed on support frames for supporting specified optical elements of the plurality of optical elements for constructing the projection optical system PL. When the driving elements are extended/contracted in an identical displacement amount or in different displacement amounts, then the specified optical element can be moved in the direction of the optical axis AX (Z direction), and/or the specified optical element can be inclined with respect to the optical axis AX. The amount of extension/contraction can be detected by a position sensor of the capacitance type or the optical type. Therefore, the image formation state of the projection optical system PL can be adjusted by displacing the specified optical element so that a target position and/or a target angle of inclination is obtained by controlling the amount of the extension/contraction of the driving element. As described later on, when the image formation state of the projection optical system PL is optimized, then the control unit CONT determines the correction amount to be used by the image formation characteristic control unit 3, and the driving element is driven in accordance with the correction amount to displace the specified optical element. Further, the image formation characteristic control unit 3 is capable of varying the pressure of the space between the optical elements. When the image formation characteristic control unit 3 is controlled by using the control unit CONT, it is possible to adjust the projection state of the projection optical system PL including, for example, various aberrations (for example, projection magnification, distortion, and spherical aberration) and the image plane position (focus position). Details of the image formation characteristic control unit are disclosed in U.S. Pat. No. 6,235,438 B1 described above. The disclosure thereof is incorporated herein by reference.

In this embodiment, the projection optical system PL is based on the reduction system having the projection magnification β which is, for example, ¼, ⅕, or ⅛. The projection optical system PL may be based on any one of the 1× magnification system and the magnifying system. The projection optical system PL is not limited to the dioptric system including no catoptric element. It is possible to use the catoptric system including no dioptric element, and the cata-dioptric system including dioptric and catoptric elements. The optical element 2, which is disposed at the end portion of the projection optical system PL of this embodiment, is exposed from the barrel PK. The liquid LQ of the liquid immersion area AR2 makes contact with the optical element 2.

The substrate stage PST comprises a Z stage 52 which supports the substrate P by the aid of a substrate holder PH, and an XY stage 53 which supports the Z stage 52. The XY stage 53 is supported on a base 54. The substrate stage PST is driven by a substrate stage-driving unit PSTD such as a linear motor. The substrate stage-driving unit PSTD is controlled by the control unit CONT. The Z stage 52 is capable of moving the substrate P supported by the substrate holder PH in the Z axis direction and the θX and θY directions (in the direction of inclination). The XY stage 53 is capable of moving the substrate P supported by the substrate holder PH in the XY directions (in the direction substantially in parallel to the image plane of the projection optical system PL) by the aid of the Z stage 52. It goes without saying that the Z stage and the XY stage are appropriately provided in an integrated manner.

A recess 50 is provided on the substrate stage PST. The substrate holder PH is arranged in the recess 50. The upper surface 51 of the substrate stage PST except for the recess 50 is a flat surface which has substantially the same height as that of (is flush with) the surface of the substrate P supported by the substrate holder PH. The upper surface 51 of the substrate stage PST has the liquid repellence with respect to the liquid LQ. The liquid immersion area AR2 can be formed satisfactorily while retaining the liquid LQ on the image plane side of the projection optical system PL even when the edge area E of the substrate P is subjected to the liquid immersion exposure, because the upper surface 51, which is substantially flush with the surface of the substrate P, is provided around the substrate P.

The movement mirror 42 is provided on the side surface of the substrate stage PST (Z stage 52). A laser interferometer 43 is provided at a position opposed to the movement mirror 42. The angle of rotation and the position in the two-dimensional direction of the substrate P on the substrate stage PST are measured in real-time by the laser interferometer 43. The result of the measurement is outputted to the control unit CONT. The control unit CONT positions the substrate P supported by the substrate stage PST in the X axis direction and the Y axis direction on the basis of the result of the measurement performed by the laser interferometer 43 by driving the XY stage 53 by the aid of the substrate stage-driving unit PSTD in the two-dimensional coordinate system defined by the laser interferometer 43.

The exposure apparatus EX has a focus-detecting system 4 for detecting the surface position information about the surface of the substrate P. The focus-detecting system 4 includes a light-emitting section 4A and a light-receiving section 4B. A detecting light beam La is radiated in an oblique direction from the light-emitting section 4A through the liquid LQ onto the surface (exposure surface) of the substrate P. A reflected light beam from the substrate P is received by the light-receiving section 4B through the liquid LQ. Accordingly, the focus-detecting system 4 detects the surface position information about the surface of the substrate P. The control unit CONT controls the operation of the focus-detecting system 4. Further, the control unit CONT detects the position (focus position) in the Z axis direction of the surface of the substrate P with respect to the image plane of the projection optical system PL on the basis of the light-receiving result of the light-receiving section 4B. The focus-detecting system 4 can also determine the posture or attitude of the substrate P in the direction of inclination by determining the respective focus positions at a plurality of points on the surface of the substrate P respectively. A system, which is disclosed, for example, in Japanese Patent Application Laid-open No. 8-37149, may be used for the focus-detecting system 4.

The control unit CONT controls the position (focus position) of the substrate P supported by the Z stage 52 in the Z axis direction and the position in the θX and θY directions by driving the Z stage 52 of the substrate stage PST by the aid of the substrate stage-driving unit PSTD. That is, the Z stage 52 is operated on the basis of the instruction from the control unit CONT based on the detection result of the focus-detecting system 4. The angle of inclination and the focus position (Z position) of the substrate P are controlled so that the surface (exposure surface) of the substrate P is adjusted to match the image plane to be formed via the projection optical system PL and the liquid LQ.

The liquid supply mechanism 10 of the liquid immersion mechanism 1 supplies the liquid LQ to the image plane side of the projection optical system PL. The liquid supply mechanism 10 comprises a liquid supply section 11 which is capable of feeding the liquid LQ, and a supply tubes 13 which has one end connected to the liquid supply section 11. The other end of the supply tube 13 is connected to the nozzle member 70. The liquid supply section 11 includes, for example, a tank for accommodating the liquid LQ, a filter unit for removing any foreign matter from the liquid LQ, and a pressurizing pump. The liquid supply section 11 further includes a temperature-regulating unit 14 which regulates the temperature of the liquid LQ. The temperature of the liquid LQ to be supplied to the image plane side of the projection optical system PL is regulated by the temperature-regulating unit 14. In this embodiment, the temperature-regulating unit 14 sets the temperature of the liquid LQ to 23.0° C. in the initial state. The temperature-regulating unit 14 can regulate the temperature of the liquid LQ at intervals of 10 mK on the basis of the instruction from the control unit CONT.

A flow rate controller 16 called mass flow controller, which controls the amount of the liquid per unit time fed from the liquid supply section 11 and supplied to the image plane side of the projection optical system PL, is provided at an intermediate position of the supply tube 13 of the liquid supply section 11. The control of the liquid supply amount based on the use of the flow rate controller 16 is performed under the instruction signal of the control unit CONT.

The liquid recovery mechanism 20 of the liquid immersion mechanism 1 recovers the liquid LQ on the image plane side of the projection optical system PL. The liquid recovery mechanism 20 comprises a liquid recovery section 21 which is capable of recovering the liquid LQ, and a recovery tube 23 which has one end connected to the liquid recovery section 21. The other end of the recovery tube 23 is connected to the nozzle member 70. The liquid recovery section 21 includes, for example, a vacuum system (suction unit) such as a vacuum pump, a gas/liquid separator for separating the gas and the recovered liquid LQ from each other, and a tank for accommodating the recovered liquid LQ. It is also allowable to use, for example, the equipment of the factory in which the exposure apparatus EX is installed, while the exposure apparatus EX is managed without providing at least a part or parts of, for example, the tank, the filter unit, the pressurizing pump, and the temperature-regulating unit 14 of the liquid supply section 11, and the vacuum system, the gas/liquid separator, and the tank of the liquid recovery section 21.

The nozzle member 70 is arranged in the vicinity of the optical element 2 which makes contact with the liquid LQ and which is included in the plurality of optical elements for constructing the projection optical system PL. The nozzle member 70 is an annular member which is provided to surround the side surface of the optical element 2 over the substrate P (substrate stage PST). A gap is provided between the nozzle member 70 and the optical element 2. The nozzle member 70 is supported by a predetermined support mechanism so that the nozzle member 70 is separated from the optical element 2 in view of the vibration. The lower surface 70A of the nozzle member 70 is opposed to the surface of the substrate P (upper surface of the substrate stage PST). The lower surface 70A of the nozzle member 70 and the lower surface 2A of the optical element 2 are substantially flat surfaces respectively. The lower surface 70A of the nozzle member 70 is substantially flush with the lower surface 2A of the optical element 2. Accordingly, the liquid immersion area AR2 can be satisfactorily formed within a desired range. The liquid contact surface (lower surface) 2A of the optical element 2 to make contact with the liquid LQ of the liquid immersion area AR2 and the liquid contact surface (lower surface) 70A of the nozzle member 70 to make contact with the liquid LQ of the liquid immersion area AR2 have the lyophilicity or liquid-attracting property with respect to the liquid LQ.

Liquid supply ports 12 for supplying the liquid LQ onto the substrate P are provided on the lower surface 70A of the nozzle member 70. The plurality of liquid supply ports 12 are provided on the lower surface 70A of the nozzle member 70. An internal flow passage, which connects the other end of the supply tube 13 and the liquid supply ports 12, is formed in the nozzle member 70.

Further, a liquid recovery port 22 for recovering the liquid LQ from the surface of the substrate P is provided on the lower surface 70A of the nozzle member 70. In this embodiment, the liquid recovery port 22 is provided on the outer side in relation to the optical axis AX of the optical element 2 to surround the liquid supply ports 12 on the lower surface 70A of the nozzle member 70. An internal flow passage, which connects the other end of the recovery tube 23 and the liquid recovery port 22, is formed in the nozzle member 70.

The operations of the liquid supply section 11 and the liquid recovery section 21 are controlled by the control unit CONT. When the liquid immersion area AR2 of the liquid LQ is formed on the substrate P, the control unit CONT feeds the liquid LQ from the liquid supply section 11 to supply the liquid LQ onto the substrate P from the liquid supply ports 12 provided over the substrate P, via the supply tube 13 and the internal flow passage of the nozzle member 70. The liquid LQ on the substrate P is recovered from the liquid recovery port 22. The liquid LQ is recovered by the liquid recovery section 21 via the recovery flow passage of the nozzle member 70 and the recovery tube 23. The arrangement or the structure of the liquid immersion mechanism 1 including the nozzle member 70 and other components is not limited to the arrangement or the structure described above. It is also possible to use, for example, those described in European Patent Publication No. 1420298, and International Publication Nos. 2004/055803, 2004/057589, 2004/057590, and 2005/029559.

A temperature sensor 60, which measures the temperature of the liquid LQ of the liquid immersion area AR2, is provided at a predetermined position of the nozzle member 70. The temperature sensor 60 is provided at the position of the lower surface 70A of the nozzle member 70 to make contact with the liquid LQ of the liquid immersion area AR2. It is enough that the temperature sensor 60 is provided at any position to make contact with the liquid LQ. For example, the temperature sensor 60 can be provided at a position inside the liquid supply port 12 and/or at a position of the optical element 2 at which the optical path for the exposure light beam EL is not disturbed. A plurality of temperature sensors 60 may be arranged. The temperature sensor 60 may be provided in the supply tube 13 or in the recovery tube 23 as well. It is a matter of course that the temperature sensors may be arranged at the respective positions as described above. The result of the measurement performed by the temperature sensor 60 is outputted to the control unit CONT.

The exposure apparatus EX further comprises a aerial image-measuring unit 500 which is capable of measuring the image formation characteristic (optical characteristic) of the projection optical system PL, as disclosed, for example, in Japanese Patent Application Laid-open Nos. 2002-14005 and 2002-198303. The aerial image-measuring unit 500 includes a light-receiving unit 503 which receives the light beam (exposure light beam EL) allowed to pass through the projection optical system PL, by the aid of a light-receiving section 501 having a slit section arranged on the image plane side of the projection optical system PL. The upper surface of the light-receiving section 501 is substantially flush with the upper surface 51 of the substrate stage PST.

The aerial image-measuring unit 500 is capable of measuring not only the image formation characteristics such as the spherical aberration, the image plane (focus position), the coma aberration, the astigmatism, the distortion, and the magnification as disclosed in the published patent documents described above but also the vibration state of the pattern image.

Figure 2:
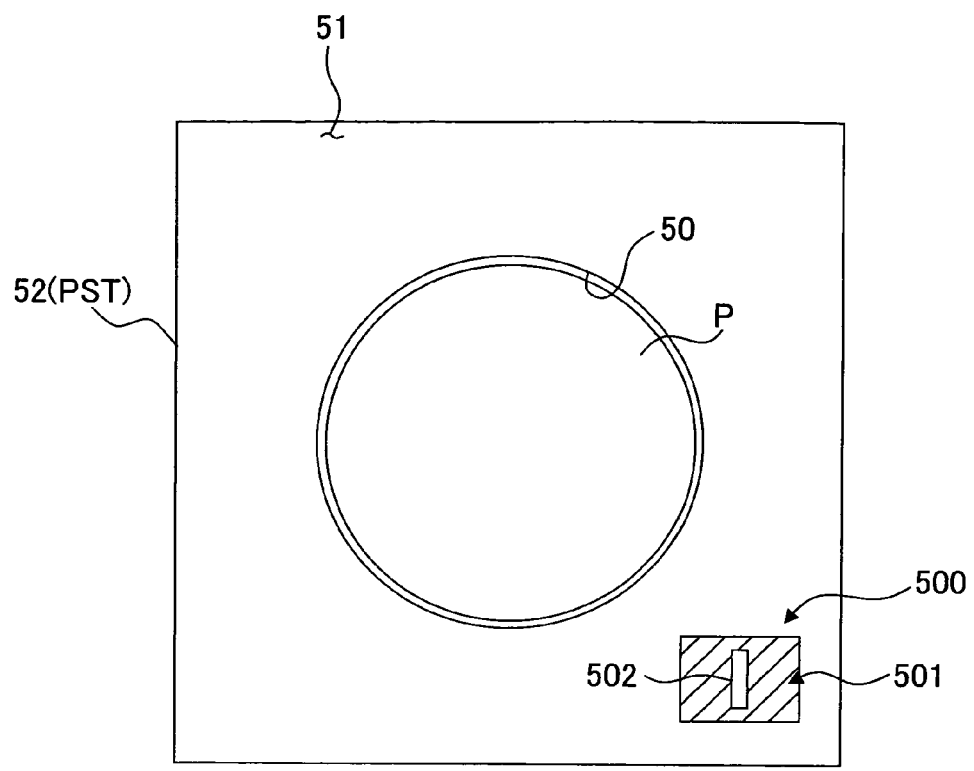
FIG. 2 shows a plan view illustrating a substrate stage.

FIG. 2 shows a plan view illustrating the substrate stage PST as viewed from an upper position. The light-receiving section 501 of the aerial image-measuring unit 500 is provided at a predetermined position on the substrate stage PST outside the substrate P. The light-receiving section 501 has the slit section 502 which is an aperture pattern. The light beam, which is radiated onto the light-receiving section 501, is transmissive through the slit section 502. The light beam, which has been transmitted through the slit section 502, is introduced, for example, via a relay optical system, into the light-receiving unit 503 (see FIG. 1) provided outside the substrate stage PST. The light-receiving unit 503 includes a photoelectric converter element. The photoelectric conversion signal supplied from the light-receiving unit 503 is outputted via a signal processing unit to the control unit CONT.

In this embodiment, the light-receiving section 501 of the aerial image-measuring unit 500 is provided on the substrate stage PST which supports the substrate P. However, it is enough that the light-receiving section 501 is arranged on the image plane side of the projection optical system PL. For example, as disclosed in Japanese Patent Application Laid-open No. 11-135400, the light-receiving section 501 may be provided on a predetermined member (for example, a measuring stage distinct from the substrate stage) other than the substrate stage PST arranged on the image plane side of the projection optical system PL.

Although not shown, for example, an uneven illuminance sensor (dose uniformity sensor) as disclosed in Japanese Patent Application Laid-open No. 57-117238 and a radiation amount sensor (dose sensor, illuminance sensor) as disclosed in Japanese Patent Application Laid-open No. 11-16816 are also provided at predetermined positions on the substrate stage PST outside the substrate P.

Figure 3:
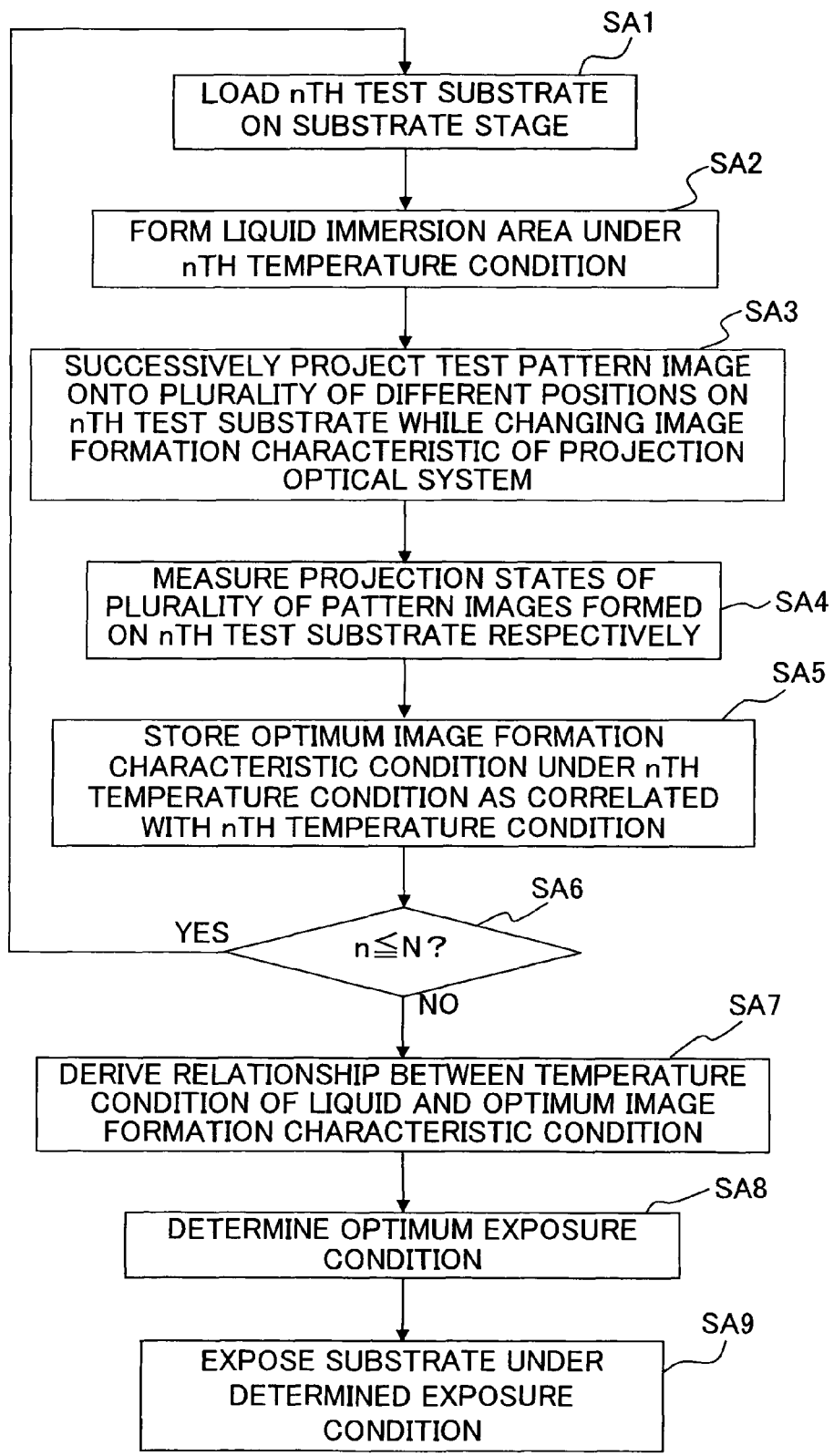
FIG. 3 shows a flow chart illustrating an exposure procedure according to the embodiment of the present invention.

Next, an explanation will be made with reference to a flow chart shown in FIG. 3 about a method for exposing the substrate P by using the exposure apparatus EX constructed as described above. In this embodiment, the exposure condition, which is to be used in order to obtain the pattern image in the optimum projection state, is determined before exposing the substrate P. In this embodiment, an explanation will be made about a method for determining the temperature condition of the liquid LQ, and the focus position and the spherical aberration easily affected by the temperature of the liquid LQ, as the exposure condition. Specifically, a plurality of (N) different temperatures $T_1$ to $T_N$ are set as the temperatures of the liquid LQ, and test substrates $Pt_1$ to $Pt_N$, which are different from each other for the respective temperatures, are prepared. Under the nth temperature condition (n=1 to N) of the liquid LQ, the test exposure is performed, in which a test pattern image is projected onto a plurality of different positions on the nth test substrate (n=1 to N) respectively while changing the image formation characteristic (focus position and spherical aberration) of the projection optical system PL. The test exposure is performed for each of the first to nth exposure conditions. The exposure condition, which is to be used when a device pattern image is projected onto the substrate P in order to manufacture a device, is determined on the basis of the projection states of the projected test pattern images.

Prior to the exposure of the substrate P, the control unit CONT firstly carries (loads) the first test substrate $Pt_1$ onto (on) the substrate stage PST (Step SA1) A test mask Mt, which has the test pattern, is supported on the mask stage MST. The test substrate, which is used in this embodiment, has the surface coated with the photoresist in the same manner as the actual substrate P.

Figure 4:
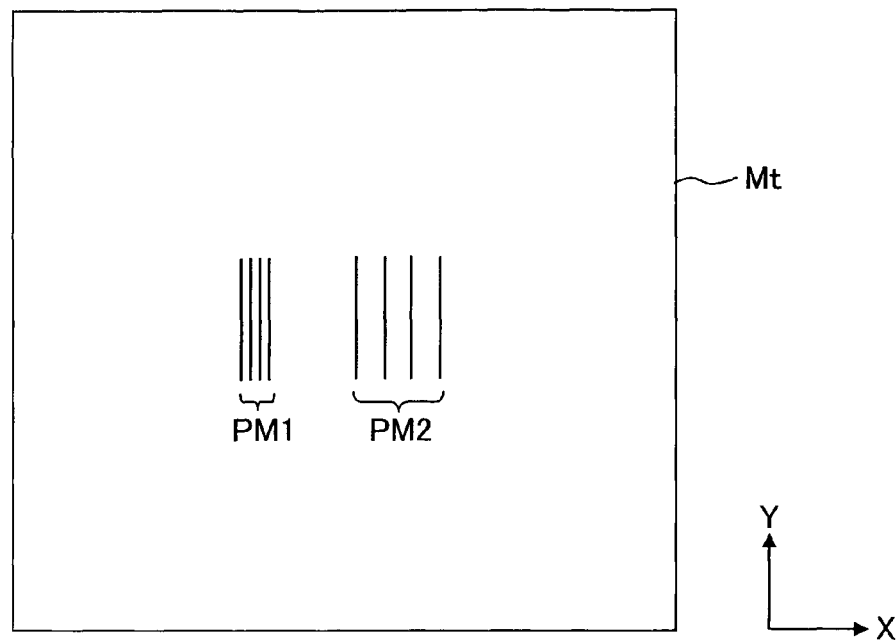
FIG. 4 shows an example of a test mask.

FIG. 4 shows an example of the test mask Mt. As shown in FIG. 4, two test patterns PM1, PM2 are formed on the test mask Mt. The first and second test patterns PM1, PM2 are line-and-space (L/S) patterns having mutually different pitches (cycles or periods) respectively. The first test pattern PM1 is the L/S pattern which has the periodic property in the X direction and which has the ratio (duty ratio) of 1:1 between the width of the line portion and the width of the space portion. The second test pattern PM2 is the L/S pattern which has the line pattern having the same dimension as that of the first test pattern PM1, the line pattern being aligned in the X axis direction at a different cycle (for example, about 1.5 to 2 times the pitch of the first test pattern PM1).

The control unit CONT uses the temperature-regulating unit 14 of the liquid supply mechanism 10 to regulate the temperature of the liquid LQ to be supplied to the space between the projection optical system PL and the first test substrate $Pt_1$ so that the temperature measured by the temperature sensor 60 is the first temperature $T_1$. The liquid immersion area AR2 of the liquid LQ, which is regulated to have the first temperature $T_1$, is formed between the projection optical system PL and the first test substrate $Pt_1$ (Step SA2).

The control unit CONT successively projects the test pattern image of the test mask Mt onto a plurality of different positions on the first test substrate $Pt_1$ respectively while changing the image formation characteristic of the projection optical system PL via the projection optical system PL and the liquid LQ set to have the first temperature $T_1$ (Step SA3). In this embodiment, the control unit CONT successively projects the test pattern image onto the plurality of different positions on the first test substrate $Pt_1$ respectively while changing the focus position and the spherical aberration of the image formation characteristic of the projection optical system PL respectively by using the image formation characteristic control unit 3. When the test pattern image is successively projected onto the plurality of different positions on the first test substrate $Pt_1$ respectively while changing the image formation characteristic of the projection optical system PL, the control unit CONT successively projects the test pattern image onto the plurality of positions on the first test substrate $Pt_1$ respectively while successively step-moving the first test substrate $Pt_1$ in the X axis direction and the Y axis direction in a state in which the position of the first test substrate $Pt_1$ in the Z axis direction is maintained.

Figure 5:
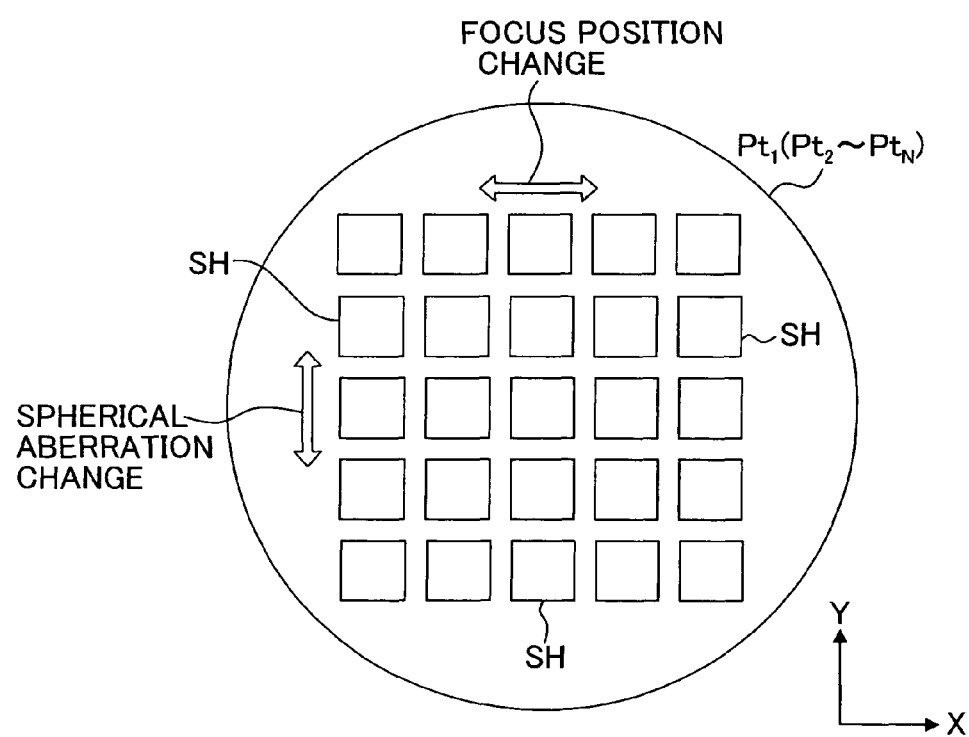
FIG. 5 shows an example of a test substrate.

As shown in FIG. 5, a plurality of shot areas SH are established in a matrix form on the first test substrate $Pt_1$. The test pattern image is successively projected onto the respective shot areas SH respectively while changing the image formation characteristic of the projection optical system PL under the first temperature condition $T_1$ of the liquid LQ. When the test pattern image of the test mask Mt is projected, the control unit CONT projects the image of the first test pattern PM1 and the image of the second test pattern PM2 respectively onto one shot area SH on the first test substrate $Pt_1$. The control unit CONT uses the image formation characteristic control unit CONT 3 for the plurality of shot areas SH, for example, such that the test pattern image is successively projected while changing the focus position of the image formation characteristic of the projection optical system PL in relation to the column direction (X axis direction as shown in FIG. 5), and the test pattern image is successively projected while changing the spherical aberration of the image formation characteristic of the projection optical system PL in relation to the row direction (Y axis direction as shown in FIG. 5). As shown in FIG. 5, each of the focus position condition and the spherical aberration condition of the projection optical system PL is changed to provide mutually different five conditions in this embodiment. However, each of the focus position condition and the spherical aberration condition may be changed to provide an arbitrary number of conditions, for example, eleven conditions.

The first test substrate $Pt_1$, on which the test pattern image has been projected onto the respective shot areas SH respectively, is unloaded from the substrate stage PST. After that, the first test substrate $Pt_1$ is developed, and concave/convex test patterns in conformity with the test pattern image are formed on the substrate. Subsequently, the shape-measuring unit 100 measures the shapes (line widths) of the test patterns formed on the respective shot areas SH on the first test substrate $Pt_1$ respectively (Step SA4). The projection state of the test pattern image projected onto the first test substrate $Pt_1$ corresponds to the shape of the test pattern actually formed as the concave/convex pattern on the first test substrate $Pt_1$. Therefore, when the shapes (line widths) of the test patterns are measured by using the shape-measuring unit 100, the projection states of the respective test pattern images are consequently measured, which are provided when the test pattern image is successively projected onto the first test substrate $Pt_1$ while changing the image formation characteristic (focus position and spherical aberration). The measurement result of the shape-measuring unit 100 is outputted to the control unit CONT.

The control unit CONT determines the correction amount to be used by the image formation characteristic control unit 3, with which it is possible to obtain the optimum relationship between the surface of the test substrate $Pt_1$ and the image plane to be formed via the projection optical system PL and the liquid LQ, i.e., the optimum focus position condition at the first temperature condition $T_1$ of the liquid LQ, from the respective test patterns formed on the shot areas SH on the first test substrate $Pt_1$ respectively. When the line pattern is projected onto the first test substrate $Pt_1$ under the optimum focus position condition, then the contrast of the projected image is maximized on the first test substrate $Pt_1$, and the line width of the line pattern formed on the first test substrate $Pt_1$ is the thinnest (shape of the pattern is sharpened). Therefore, the control unit CONT can determine the shot area SH having the line pattern with the thinnest line width from the respective line patterns (test patterns) formed on the plurality of shot areas SH on the first test substrate $Pt_1$ respectively on the basis of the measurement result of the shape-measuring unit 100. The control unit CONT can determine the image formation characteristic (focus position) obtained when the line pattern image is projected onto the concerning shot area SH, and the control unit CONT can consequently determine the correction amount to be used by the image formation characteristic control unit CONT 3 in order to obtain the concerning image formation characteristic (focus position). There is no limitation to the shot area having the line pattern with the thinnest line width. It is also allowable to determine the shot area SH having the line pattern with a desired line width.

When the control unit CONT determines the optimum focus position condition, the optimum image formation position condition can be also determined on the basis of only the image of one test pattern of the images of the first and second test patterns PM1, PM2 projected onto each of the shot areas SH.

On the other hand, the control unit CONT determines the optimum spherical aberration condition to minimize the spherical aberration via the projection optical system PL and the liquid LQ under the first temperature condition $T_1$ of the liquid LQ, from the respective test patterns formed on the shot areas SH on the first test substrate $Pt_1$ respectively, and the control unit CONT consequently determines the correction amount to be used by the image formation characteristic control unit 3 which makes it possible to obtain the optimum spherical aberration condition. In general, the angle of diffraction mutually differs between the pattern having the large pitch and the pattern having the small pitch on the mask. Therefore, the image formation position in the optical axis direction (Z axis direction) differs between the pattern having the large pitch and the pattern having the small pitch. The spherical aberration is one of the aperture aberrations of the optical system. The spherical aberration results from the fact that when light fluxes having various apertures come into the optical system from the object point on the optical axis, the corresponding image points are not focused on one point. Therefore, the optimum spherical aberration condition, in which the spherical aberration is minimized, resides in the state in which the difference between the optimum focus position $Z_1$ of the first test pattern PM1 and the optimum focus position $Z_2$ of the second test pattern PM2 is the smallest, i.e., the state in which the difference between the line width of the first test pattern PM1 and the line width of the second test pattern PM2 formed on the test substrate is the smallest. Accordingly, the control unit CONT can determine the shot area SH having the first and second test patterns PM1, PM2 in which the line width difference is the smallest, from the respective first and second test patterns PM1, PM2 formed on the plurality of shot areas SH on the first test substrate $Pt_1$ respectively on the basis of the measurement result of the shape-measuring unit 100. The control unit CONT can determine the image formation characteristic (spherical aberration) obtained when the images of the first and second test patterns PM1, PM2 are projected onto the concerning shot area SH, and the control unit CONT can consequently determine the correction amount to be used by the image formation characteristic control unit 3 in order to obtain the concerning image formation characteristic (spherical aberration).

The control unit CONT stores the optimum image formation characteristic condition (optimum focus position condition and optimum spherical aberration condition) in which the line width is the thinnest and the line width difference between the first test pattern PM1 and the second test pattern PM2 is the smallest, of the patterns formed on the first test substrate $Pt_1$ under the first temperature condition $T_1$ of the liquid LQ, and the control unit CONT consequently stores the optimum correction amount to be used by the image formation characteristic control unit 3 with which it is possible to obtain the optimum image formation characteristic condition, as correlated with the first temperature condition $T_1$ (Step SA5).

Subsequently, the control unit CONT judges whether or not the processing is completed in the same manner as described above for each of the plurality of (N) previously prescribed temperature conditions of the liquid LQ (Step SA6). If the processing is not completed, Steps SA1 to SA5 are executed under the next temperature condition. That is, the control unit CONT carries the second test substrate $Pt_2$ onto the substrate stage PST (Step SA1). The control unit CONT regulates the temperature of the liquid LQ to be supplied to the space between the projection optical system PL and the second test substrate $Pt_2$ so that the temperature of the liquid LQ measured by the temperature sensor 60 is the second temperature $T_2$ ($=T_1+\Delta T$). The liquid immersion area AR2 of the liquid LQ regulated to have the second temperature $T_2$ is formed between the projection optical system PL and the second test substrate $Pt_2$ (Step SA2). In the same manner as described above, the control unit CONT successively projects the test pattern image of the test mask Mt onto a plurality of different positions on the second test substrate $Pt_2$ respectively while changing the image formation characteristic of the projection optical system PL via the projection optical system PL and the liquid LQ set to have the second temperature $T_2$ (Step SA3). Subsequently, the shape-measuring unit 100 measures the shapes (line widths) of the test patterns formed on the respective shot areas SH on the second test substrate $Pt_2$ respectively (Step SA4). The control unit CONT determines the optimum image formation characteristic condition (optimum correction amount condition of the image formation characteristic control unit 3) under the second temperature condition $T_2$ on the basis of the measurement result of the shape-measuring unit 100 to store the optimum image formation characteristic condition as correlated with the second temperature condition $T_2$ (Step SA5).

The processing is performed thereafter in the same manner as described above from the third temperature $T_3$ ($=T+2\times\Delta T$) to the Nth temperature $T_N$ ($=T_1+(N-1)\times\Delta T$) respectively. That is, the test pattern image is successively projected while changing the focus position and the spherical aberration of the projection optical system PL under each of the first to Nth temperature conditions.

In this embodiment, the reference value (central value) resides in 23° C. for the temperature condition of the liquid LQ. The temperature of the liquid LQ is changed from –100 mK to +100 mK based on the reference of 23° C. at intervals of 10 mK, that is, $\Delta T=10$ mK.

After the optimum image formation characteristic conditions are determined and stored for the first to Nth temperature conditions respectively, the control unit CONT derives the relationship between the stored optimum image formation characteristic condition and the temperature condition of the liquid LQ (Step SA7). The control unit CONT determines the image formation characteristic and the temperature condition of the liquid LQ which are optimum when the pattern image is projected, i.e., the optimum exposure condition on the basis of the derived result (Step SA8).

Figure 6:
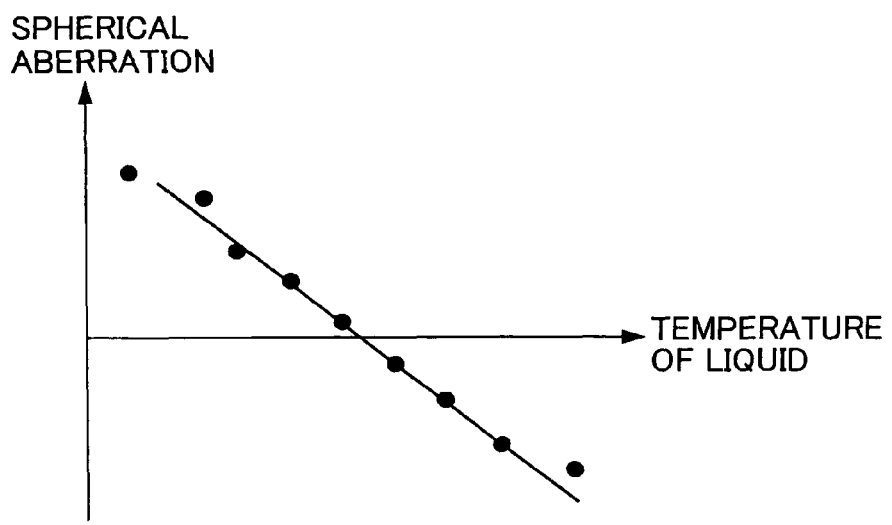
FIG. 6 schematically shows the relationship between the liquid temperature and the spherical aberration.

Specifically, the control unit CONT performs the calculation processing such as the fitting on the basis of the relationship between the temperature of the liquid LQ and the image formation characteristic corresponding to the temperature. The relationship is plotted in FIG. 6 in relation to the temperature of the liquid LQ and the optimum spherical aberration determined as described above corresponding to the temperature. The relationship is subjected to the fitting on the basis of, for example, the least square method. With reference to FIG. 6, the determined optimum exposure condition includes the correction amount of the image formation characteristic control unit 3 in order to realize the optimum spherical aberration condition under which the spherical aberration is zero, and the temperature condition of the liquid LQ provided under the concerning condition. Similarly, the control unit CONT determines the correction amount of the image formation characteristic control unit 3 in order to realize the optimum focus position condition and the temperature condition of the liquid LQ under the concerning condition as the optimum exposure condition on the basis of the relationship between the temperature of the liquid LQ and the optimum focus position corresponding to the temperature. In this way, the control unit CONT measures the projection states of the successively projected test pattern images while changing the temperature condition of the liquid LQ, and the control unit CONT determines the optimum exposure condition, i.e., the image formation characteristic of the projection optical system including the temperature condition of the liquid, the spherical aberration, and the focus position, as well as the optimum correction amount of the image formation characteristic control unit 3, on the basis of the measured projection states of the test pattern images.

In FIG. 6, the relationship between the temperature of the liquid and the spherical aberration is changed linearly. However, when the change is not linear, it is preferable that attention is paid to the data points when the linear fitting is performed, and the fitting is performed within a range in which the relationship can be regarded to be linear.

Subsequently, the control unit CONT carries (loads) the mask M having a pattern for forming a device onto (on) the mask stage MST, and the control unit CONT carries (loads) the substrate P for forming the device onto (on) the substrate stage PST. The control unit CONT illuminates the mask M with the exposure light beam EL by using the illumination optical system IL under the determined exposure condition to expose the substrate P by projecting the pattern image of the mask M onto the substrate P via the projection optical system PL and the liquid LQ (Step SA9). That is, the control unit CONT controls the temperature-regulating unit 14 of the liquid supply mechanism 10 so that the measurement result of the temperature sensor 60 is coincident with the temperature condition (reference value $T_0$) of the liquid LQ determined in Step SA8 to form the liquid immersion area AR2 of the temperature-regulated liquid LQ. The substrate P is exposed while adjusting the image formation characteristic of the projection optical system PL on the basis of the determined correction amount of the image formation characteristic control unit 3 so that the optimum image formation characteristic is obtained under the temperature condition of the liquid LQ.

The temperature of the liquid LQ of the liquid immersion area AR2 is regulated by the temperature-regulating unit 14 so that the measured value of the temperature sensor 60 is the reference value $T_0$. However, for example, when the temperature of the liquid LQ of the liquid immersion area AR2 is locally fluctuated, for example, due to the radiation of the exposure light beam EL, then the control unit CONT may use the image formation characteristic control unit 3 to control the image formation characteristic (spherical aberration and focus position) of the projection optical system PL so that the optimum projection state is obtained, and/or the control unit CONT may move the substrate stage PST which supports the substrate P so that the surface of the substrate P is matched with the image plane to be formed via the projection optical system PL and the liquid LQ.

As explained above, the pattern image is actually projected via the projection optical system PL and the liquid LQ while changing the temperature condition of the liquid LQ to determine the exposure condition to be used when the pattern image is projected onto the substrate P, specifically the temperature condition of the liquid LQ, the image formation characteristic including the spherical aberration and the focus position of the projection optical system, and the correction amount (adjustment amount) of the image formation characteristic control unit 3 in order to obtain the optimum image formation characteristic, on the basis of the projection state. Therefore, the optimum exposure condition can be determined on the basis of the actual projection state. The substrate P can be exposed satisfactorily by exposing the substrate P under the determined optimum exposure condition.

When the projection optical system PL of the liquid immersion exposure apparatus is designed, it is conceived that the temperature of the liquid LQ to be used is designated as the designed value, and the projection optical system PL is designed on the basis of the temperature condition of the liquid LQ based on the designed value so that the optimum image formation characteristic is obtained. When the substrate P is actually exposed via the projection optical system PL and the liquid LQ, the temperature of the liquid LQ to be supplied to the image plane side of the projection optical system PL is regulated by the temperature-regulating unit 14 so that the measured value of the temperature sensor 60 is coincident with the temperature condition of the liquid LQ based on the designed value. However, even when the temperature of the liquid LQ to be supplied to the image plane side of the projection optical system PL can be regulated highly accurately by using the temperature-regulating unit 14, it is difficult to know the absolute value of the temperature of the liquid LQ to be supplied at the accuracy of 1 mK or 10 mK on the basis of the measured value of the temperature sensor 60 in view of, for example, the measuring ability of the temperature sensor. Therefore, when the temperature of the liquid LQ is regulated on the basis of the measured value of the temperature sensor 60 as described above, it is feared that any ideal projection state cannot be obtained.

Accordingly, in the embodiment of the present invention, the pattern image is actually projected via the projection optical system PL and the liquid LQ, and the projection state is measured to determine the temperature of the liquid LQ measured by the temperature sensor 60 when the desired projection state is obtained and the correction amount of the image formation characteristic control unit 3 in order to obtain the image formation characteristic of the projection optical system PL. The state is maintained, and thus the substrate P can be exposed satisfactorily under the optimum exposure condition.

In the embodiment described above, the pattern image is successively projected while changing the image formation characteristic (focus position) of the projection optical system PL under each of the first to Nth temperature conditions of the liquid LQ while step-moving the substrate P in the XY directions in the state in which the position of the substrate P in the Z axis direction is maintained. The exposure condition is determined on the basis of the projection states of the plurality of pattern images projected under the respective first to Nth temperature conditions respectively. However, the pattern image may be successively projected while changing the position of the substrate P in the Z axis direction in place of the change of the image formation characteristic (focus position) of the projection optical system PL. That is, the pattern image may be successively projected while changing the position of the surface of the substrate P onto which the pattern image is projected, with respect to the image plane formed via the projection optical system PL and the liquid LQ under the first to Nth temperature conditions of the liquid LQ respectively. The exposure condition may be determined on the basis of the projection states of the plurality of pattern images projected under the respective first to Nth temperature conditions respectively. In order to change the positional relationship between the image plane formed by the projection optical system PL and the surface of the substrate P onto which the pattern image is projected, for example, the substrate stage PST may be moved in the Z axis direction.

In the embodiment described above, Steps SA1 to SA3 are executed under the next condition (temperature condition) of the liquid LQ after the completion of Step SA4 and Step SA5. However, it is also allowable to concurrently execute Steps SA1 to SA3 under the next condition (temperature condition) of the liquid LQ and Steps SA4 and SA5 under the previous condition (temperature condition) of the liquid LQ. Of course, the shapes (line widths) of the patterns formed on the respective test substrates may be measured after exposing the N sheets of the test substrates under all of the conditions of the liquid LQ.

In the embodiment described above, the first test substrate $Pt_1$ is used under the first temperature condition $T_1$, the second test substrate $Pt_2$ is used under the second temperature condition $T_2$, and the Nth test substrate $Pt_N$ is used under the Nth temperature condition $T_N$. However, for example, when the first test substrate $Pt_1$ is used, the pattern image may be projected onto the shot areas SH on the first test substrate $Pt_1$ respectively while changing the temperature condition of the liquid LQ.

In the embodiment described above, the pattern image is projected onto the test substrate, and the shape of the developed pattern formed on the test substrate is measured. However, for example, a photosensitized latent image can be also measured even when the development is not performed. In the embodiment described above, the projection state of the pattern image is measured by the shape-measuring unit 100. However, the projection state of the pattern image may be measured by using the aerial image-measuring unit 500. As described above, the aerial image-measuring unit 500 photoelectrically detects the pattern image by the aid of the light-receiving section 501 arranged on the image plane side of the projection optical system PL.

Figure 7:
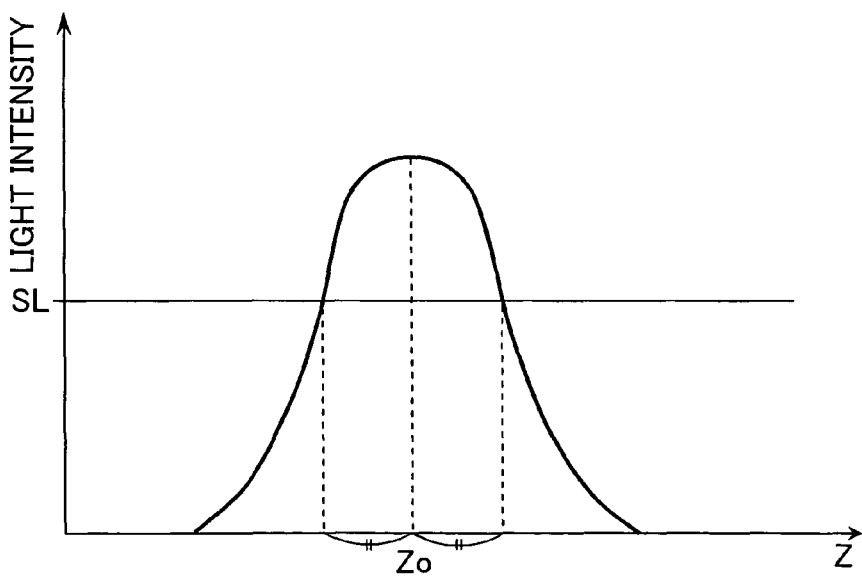
FIG. 7 illustrates the measurement of the focus position based on the use of an aerial image-measuring unit.

For example, when the optimum image formation position is measured via the projection optical system PL and the liquid LQ by using the aerial image-measuring unit 500, the control unit CONT allows the optical element 2 of the projection optical system PL to be opposed to the light-receiving section 501 on the substrate stage PST. The liquid immersion area AR2 of the liquid LQ, which is regulated so that the measured value of the temperature sensor 60 is the first temperature $T_1$, is formed between the optical element 2 of the projection optical system PL and the light-receiving section 501 on the substrate stage PST by using the liquid immersion mechanism 1. The control unit CONT drives and controls the movable blind provided for the illumination optical system IL to define the illumination area so that the exposure light beam EL is radiated onto only the first test pattern PM1 of the test mask Mt shown in FIG. 4. In this state, the control unit CONT radiates the exposure light beam EL onto the test mask Mt (first test pattern PM1) to perform the measurement of the aerial image of the first test pattern PM1 in accordance with the slit-scan system by using the aerial image-measuring unit 500 while scanning the substrate stage PST in the X axis direction. In this procedure, the control unit CONT repeats the measurement of the aerial image of the first test pattern PM1 a plurality of times while changing the focus position of the projection optical system PL by using the image formation characteristic control unit 3 in a state in which the position of the substrate stage PST in the Z axis direction is maintained, and the control unit CONT stores the light intensity signals (photoelectric conversion signals) obtained by the respective repetitions. Alternatively, the measurement of the aerial image of the first test pattern PM1 may be repeated a plurality of times while changing the position of the substrate stage PST in the Z axis direction at a predetermined step pitch in a state in which the driving of the image formation characteristic control unit 3 is stopped, and the light intensity signals (photoelectric conversion signals) obtained by the respective repetitions may be stored. The control unit CONT performs the Fourier transformation for the plurality of light intensity signals (photoelectric conversion signals) obtained by the repetitions respectively to determine the contrast of each of them as the amplitude ratio between the 1st order frequency component and the 0-order frequency component. When the aerial image-measuring unit 500 is used as described above, it is possible to obtain the light intensity signal as shown in FIG. 7. In this procedure, the position of the peak of the signal waveform of the light intensity signal may be found out directly, and thus the Z position of the concerning point may be regarded as the optimum focus position $Z_0$. Alternatively, the light intensity signal may be sliced with a predetermined slice level line SL. The Z position, which is disposed at the midpoint between the two points of intersection between the light intensity signal and the slice level line SL, may be regarded as the optimum focus position $Z_0$. The control unit CONT stores the correction amount of the image formation characteristic control unit 3 (or the Z position of the Z stage 52) corresponding to the light intensity signal at which the contrast is maximized, as the optimum correction amount of the image formation characteristic control unit 3 which makes it possible to obtain the optimum focus position condition under the first temperature condition $T_1$. The processing, which is the same as the processing as described above, is performed for the second to Nth temperature conditions of the liquid LQ respectively. Accordingly, it is possible to determine the optimum exposure condition, i.e., the optimum liquid temperature condition and the optimum focus position condition.

When the spherical aberration is measured via the projection optical system PL and the liquid LQ by using the aerial image-measuring unit 500, the control unit CONT allows the optical element 2 of the projection optical system PL to be opposed to the light-receiving section 501 on the substrate stage PST. The control unit CONT forms the liquid immersion area AR2 of the liquid LQ regulated so that the measured value of the temperature sensor 60 is the first temperature $T_1$, between the optical element 2 of the projection optical system PL and the light-receiving section 501 on the substrate stage PST by using the liquid immersion mechanism 1. The control unit CONT drives and controls the movable blind provided for the illumination optical system IL to define the illumination area so that the exposure light beam EL is radiated onto only the first test pattern PM1 of the test mask Mt shown in FIG. 4. In this state, the control unit CONT radiates the exposure light beam EL onto the test mask Mt (first test pattern PM1) to perform the measurement of the aerial image of the first test pattern PM1 via the projection optical system PL and the liquid LQ in accordance with the slit-scan system by using the aerial image-measuring unit 500. In this procedure, the control unit CONT repeats the measurement of the aerial image of the first test pattern PM1 a plurality of times while changing the focus position of the projection optical system PL by using the image formation characteristic control unit 3 in a state in which the position of the substrate stage PST in the Z axis direction is maintained, and the control unit CONT stores the light intensity signals (photoelectric conversion signals) obtained by the respective repetitions. Subsequently, the control unit CONT drives and controls the movable blind so that the exposure light beam EL is radiated onto the second test pattern PM2. The aerial image measurement is performed via the projection optical system PL and the liquid LQ for the image of the second test pattern PM2 in accordance with the slit-scan system while changing the focus position by means of the image formation characteristic control unit 3 for the first temperature condition $T_1$ of the liquid LQ in the same manner as described above. The processing as described above is repeatedly executed while changing the image formation characteristic (spherical aberration) of the projection optical system PL. After the measurement is completed for the first temperature condition $T_1$ of the liquid LQ, the processing, which is the same as the processing as described above, is also performed for each of the second to Nth temperature conditions of the liquid LQ. The control unit CONT stores, as the optimum exposure condition, the correction amount of the image formation characteristic control unit 3 and the temperature of the liquid LQ at which the difference between the optimum focus position of the first test pattern PM1 and the optimum focus position of the second test pattern PM2 is the smallest (spherical aberration is the smallest), and the contrast of the light intensity signal is maximum. Thus, the temperature condition of the liquid LQ and the correction amount of the image formation characteristic control unit 3 for minimizing the spherical aberration are determined.

When the aerial image-measuring unit 500 is used, the surface position of the aerial image-measuring unit 500 with respect to the image plane of the projection optical system PL may be changed as well, in place of the change of the focus position of the projection optical system PL by using the image formation characteristic control unit 3.

In the embodiment described above, the pattern image is successively projected via the projection optical system PL while changing the temperature condition of the liquid LQ as the condition of the liquid LQ. However, the image of the test pattern may be projected while changing the refractive index of the liquid LQ by adding an additive. For example, the pattern image may be successively projected via the projection optical system PL while changing the condition including, for example, the supply position and the recovery position for the liquid LQ and the liquid supply amount (flow rate) per unit time to be supplied to the image plane side of the projection optical system PL via the liquid supply port 12. The exposure condition, which is to be used when the device pattern is projected onto the substrate P, may be determined on the basis of the projection state of the pattern image obtained as described above. There is such a possibility that the projection state of the pattern image (including the vibration state) may be also changed depending on the liquid supply amount per unit time and the supply position and the recovery position for the liquid LQ. Therefore, the optimum exposure condition, which is to be used when the device pattern is projected onto the substrate P, can be determined on the basis of the projection state of the pattern image by successively projecting the pattern image via the projection optical system PL while changing the condition other than the temperature condition of the liquid LQ.

As described above, in the case of the liquid immersion exposure, the pattern image is projected onto the substrate through the liquid immersion area. Therefore, the projection state of the pattern image is affected by the state of the liquid immersion area and the physical quantity of the liquid itself for forming the liquid immersion area. In particular, there is such a possibility that the fluidization of the liquid and the depth and the width of the liquid immersion area also affect the projection state of the pattern image in the dynamic liquid immersion area which is maintained by the supply and the recovery of the liquid. In this embodiment, the term "condition of liquid" is the concept which includes not only the physical quantity of the liquid itself such as the temperature, the pressure, the refractive index, the density, and the component (composition and purity) of the liquid, but also the state of the liquid immersion area such as the amount of supply or recovery of the liquid for forming the liquid immersion area, the state (for example, the flow rate) of the liquid immersion area depending on, for example, the supply or recovery position, and the thickness and the width (size) of the liquid immersion area. Therefore, it is significant that the projection state of the pattern image is measured while changing one of the conditions of the liquid as described above or the combination thereof, and the optimum exposure condition is determined and stored in the memory in accordance with the correlating relationship between the condition of the liquid and the projection state, without being limited to the temperature and the temperature distribution of the liquid.

In the embodiment described above, the projection state of the image of the test pattern image provided on the test mask Mt is measured in order to determine the exposure condition. The exposure condition, which is to be used when the image of the device pattern provided on the mask M is projected, is determined on the basis of the obtained measurement result. However, when the exposure condition is determined, the projection state of the image of the device pattern provided on the mask M may be measured without using the test pattern of the test mask Mt. The exposure condition may be determined on the basis of the obtained measurement result. Alternatively, it is also allowable to use a transmissive member which is formed with the test pattern and which is fixed in the vicinity of the position at which the mask M is carried on the mask stage MST.

In the embodiment described above, the image of the test pattern is projected while changing the focus position and the spherical aberration of the projection optical system PL. However, the image of the test pattern may be projected while changing any one of them. Alternatively, the image of the test pattern may be projected while changing the other image formation characteristic such as the distortion. Further alternatively, the image of the test pattern may be projected while changing the polarization state and/or the state of the wavefront aberration. In this case, measuring units for the polarization and the wavefront aberration may be carried in place of the aerial image-measuring unit 500 or in addition to the aerial image-measuring unit 500. The measuring units may be used to measure the projection state of the image of the pattern.

The measurement of the projection state of the pattern image as described above may be executed while changing the condition of the liquid LQ for every illumination condition (for example, four-spot (quadrupole) illumination, two-spot (dipole) illumination, zonal (annular) illumination, linearly polarized illumination, and circularly polarized illumination). Alternatively, the measurement can be also executed while changing the condition of the liquid LQ for every characteristic of the mask M (for example, type (binary type, phase shift type or the like), pattern density, and pattern distribution).

In the embodiment described above, the information about the measurement result of the shape-measuring unit 100 is transmitted to the control unit CONT of the exposure apparatus EX. However, the optimum exposure condition may be determined by collecting, in an external host computer or the like, after collecting the information about the measurement result of the shape-measuring unit 100 and the information about the condition under which the test substrate is exposed (for example, liquid condition and image formation characteristic of projection optical system PL (focus position and spherical aberration)).

As described above, pure water is used as the liquid LQ in the embodiment of the present invention. Pure water is advantageous in that pure water is available in a large amount with ease, for example, in the semiconductor production factory, and pure water exerts no harmful influence, for example, on the optical element (lens) and the photoresist on the substrate P. Further, pure water exerts no harmful influence on the environment, and the content of impurity is extremely low. Therefore, it is also expected to obtain the function to wash the surface of the substrate P and the surface of the optical element provided at the end surface of the projection optical system PL. When the purity of pure water supplied from the factory or the like is low, it is also allowable that the exposure apparatus is provided with an ultra pure water-producing unit. In view of the fact as described above, it is significant that the projection states of the projection optical system are measured with pure waters having various purities, and the exposure conditions in conformity with the purities are determined and stored.

It is approved that the refractive index n of pure water (water) with respect to the exposure light beam EL having a wavelength of about 193 nm is approximately 1.44. When the ArF excimer laser beam (wavelength: 193 nm) is used as the light source of the exposure light beam EL, then the wavelength is shortened on the substrate P by 1/n, i.e., to about 134 nm, and a high resolution is obtained. Further, the depth of focus is magnified about n times, i.e., about 1.44 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

When the liquid immersion method is used as described above, the numerical aperture NA of the projection optical system is 0.9 to 1.3 in some cases. When the numerical aperture NA of the projection optical system is large as described above, it is desirable to use the polarized illumination, because the image formation performance is deteriorated due to the polarization effect in some cases with the random polarized light which has been hitherto used as the exposure light beam. In this case, it is appropriate that the linear polarized illumination, which is adjusted to the longitudinal direction of the line pattern of the line-and-space pattern of the mask (reticle), is effected so that the diffracted light of the S-polarized light component (TE-polarized light component), i.e., the component in the polarization direction along with the longitudinal direction of the line pattern is dominantly allowed to outgo from the pattern of the mask (reticle). When the space between the projection optical system PL and the resist applied to the surface of the substrate P is filled with the liquid, the diffracted light of the S-polarized light component (TE-polarized light component), which contributes to the improvement in the contrast, has the high transmittance on the resist surface, as compared with the case in which the space between the projection optical system PL and the resist applied to the surface of the substrate P is filled with the air (gas). Therefore, it is possible to obtain the high image formation performance even when the numerical aperture NA of the projection optical system exceeds 1.0. Further, it is more effective to appropriately combine, for example, the phase shift mask and the oblique incidence illumination method (especially the dipole illumination method) adjusted to the longitudinal direction of the line pattern as disclosed in Japanese Patent Application Laid-open No. 6-188169. In particular, the combination of the linear polarized illumination method and the dipole illumination method is effective when the periodic direction of the line-and-space pattern is restricted to one predetermined direction and when the hole pattern is clustered in one predetermined direction. For example, when a phase shift mask of the half tone type having a transmittance of 6% (pattern having a half pitch of about 45 nm) is illuminated by using the linear polarized illumination method and the dipole illumination method in combination, the depth of focus (DOF) can be increased by about 150 nm as compared with the use of the random polarized light provided that the illumination σ, which is prescribed by the circumscribed circle of the two light fluxes for forming the dipole on the pupil plane of the illumination system, is 0.95, the radius of each of the light fluxes at the pupil plane is 0.125σ, and the numerical aperture of the projection optical system PL is NA=1.2.

For example, when the ArF excimer laser is used as the exposure light beam, and the substrate P is exposed with a fine line-and-space pattern (for example, line-and-space of about 25 to 50 nm) by using the projection optical system PL having a reduction magnification of about ¼, then the mask M acts as a polarizing plate due to the Wave guide effect depending on the structure of the mask M (for example, the pattern fineness and the thickness of chromium), and the diffracted light of the S-polarized light component (TE-polarized light component) outgoes from the mask M in an amount larger than that of the diffracted light of the P-polarized light component (TM-polarized light component) which lowers the contrast. In this case, it is desirable to use the linear polarized illumination as described above. However, even when the mask M is illuminated with the random polarized light, it is possible to obtain the high resolution performance even when the numerical aperture NA of the projection optical system PL is large, i.e., 0.9 to 1.3.

When the substrate P is exposed with an extremely fine line-and-space pattern on the mask M, there is such a possibility that the P-polarized light component (TM-polarized light component) is larger than the S-polarized light component (TE-polarized light component) due to the Wire Grid effect. However, for example, when the ArF excimer laser is used as the exposure light beam, and the substrate P is exposed with a line-and-space pattern larger than 25 nm by using the projection optical system PL having a reduction magnification of about ¼, then the diffracted light of the S-polarized light component (TE-polarized light component) outgoes from the mask M in an amount larger than that of the diffracted light of the P-polarized light component (TM-polarized light component). Therefore, it is possible to obtain the high resolution performance even when the numerical aperture NA of the projection optical system PL is large, i.e., 0.9 to 1.3.

Further, it is also effective to use the combination of the oblique incidence illumination method and the polarized illumination method in which the linear polarization is effected in the tangential (circumferential) direction of the circle having the center of the optical axis as disclosed in Japanese Patent Application Laid-open No. 6-53120, without being limited to only the linear polarized illumination (S-polarized illumination) adjusted to the longitudinal direction of the line pattern of the mask (reticle). In particular, when the pattern of the mask (reticle) includes not only the line pattern extending in one predetermined direction, but the pattern also includes the line patterns extending in a plurality of different directions in a mixed manner (line-and-space patterns having different periodic directions are present in a mixed manner), then it is possible to obtain the high image formation performance even when the numerical aperture NA of the projection optical system is large, by using, in combination, the zonal illumination method and the polarized illumination method in which the light is linearly polarized in the tangential direction of the circle having the center of the optical axis, as disclosed in Japanese Patent Application Laid-open No. 6-53120 as well. For example, when a phase shift mask of the half tone type having a transmittance of 6% (pattern having a half pitch of about 63 nm) is illuminated by using, in combination, the zonal illumination method (zonal ratio: 3/4) and the polarized illumination method in which the light is linearly polarized in the tangential direction of the circle having the center of the optical axis, the depth of focus (DOF) can be increased by about 250 nm as compared with the use of the random polarized light provided that the illumination σ is 0.95 and the numerical aperture of the projection optical system PL is NA=1.00. In the case of a pattern having a half pitch of about 55 nm and a numerical aperture of the projection optical system NA=1.2, the depth of focus can be increased by about 100 nm.

In the embodiment of the present invention, the optical element 2 is attached to the end portion of the projection optical system PL. Such a lens makes it possible to adjust the optical characteristics of the projection optical system PL, for example, the aberration (for example, spherical aberration and coma aberration). The optical element, which is attached to the end portion of the projection optical system PL, may be an optical plate which is usable to adjust the optical characteristics of the projection optical system PL. Alternatively, the optical element may be a plane parallel plate or parallel flat plate through which the exposure light beam EL is transmissive.

When the pressure, which is generated by the flow of the liquid LQ, is large between the substrate P and the optical element disposed at the end portion of the projection optical system PL, it is also allowable that the optical element is tightly fixed so that the optical element is not moved by the pressure, without allowing the optical element to be exchangeable.

In the embodiment of the present invention, the space between the projection optical system PL and the surface of the substrate P is filled with the liquid LQ. However, for example, it is also allowable that the space is filled with the liquid LQ in such a state that a cover glass composed of a plane-parallel plate is attached to the surface of the substrate P. In this case, the space between the cover glass and the substrate may be filled with the liquid. Alternatively, it is enough that the space is not filled with the liquid.

The liquid LQ is water in the embodiment of the present invention. However, the liquid LQ may be any liquid other than water. For example, when the light source of the exposure light beam EL is the $F_2$ laser, the $F_2$ laser beam is not transmitted through water. Therefore, those preferably usable as the liquid LQ may include, for example, fluorine-based fluids such as fluorine-based oil and perfluoropolyether (PFPE) through which the $F_2$ laser beam is transmissive. In this case, the portion, which makes contact with the liquid LQ, is subjected to a liquid-attracting treatment by forming, for example, a thin film with a substance having a molecular structure containing fluorine having small polarity. Alternatively, other than the above, it is also possible to use, as the liquid LQ, those (for example, cedar oil) which have the transmittance with respect to the exposure light beam EL, which have the refractive index as high as possible, and which are stable against the photoresist applied to the surface of the substrate P and the projection optical system PL. Also in this case, the surface treatment is performed depending on the polarity of the liquid LQ to be used. It is also possible to use various fluids having desired refractive indexes including, for example, supercritical fluids, in place of pure water as the liquid LQ. In this application, such a fluid is regarded as the liquid. A variety of liquids are usable as the liquid LQ depending on the light source and the way of use as described above. Therefore, the projection states of the pattern image can be measured as the "condition of the liquid" for each of the liquid species in accordance with the present invention, and the optimum exposure conditions can be determined beforehand respectively. The control unit CONT can control, for example, the image formation characteristic so that the optimum exposure condition is provided depending on the liquid to be used.

The substrate P, which is usable in the respective embodiments described above, is not limited to the semiconductor wafer for producing the semiconductor device. Those applicable include, for example, the glass substrate for the display device, the ceramic wafer for the thin film magnetic head, and the master plate (synthetic quartz, silicon wafer) for the mask or the reticle to be used for the exposure apparatus. In the embodiment described above, the light-transmissive type mask (reticle) is used, in which the predetermined light-shielding pattern (or phase pattern or dimming or light-reducing pattern) is formed on the light-transmissive substrate. However, in place of such a reticle, as disclosed, for example, in U.S. Pat. No. 6,778,257, it is also allowable to use an electronic mask on which a transmissive pattern, a reflective pattern, or a light-emitting pattern is formed on the basis of the electronic data of the pattern to be subjected to the exposure.

As for the exposure apparatus EX, the present invention is also applicable to the scanning type exposure apparatus (scanning stepper) based on the step-and-scan system for performing the scanning exposure with the pattern of the mask M by synchronously moving the mask M and the substrate P as well as the projection exposure apparatus (stepper) based on the step-and-repeat system for performing the full field exposure with the pattern of the mask M in a state in which the mask M and the substrate P are allowed to stand still, while successively step-moving the substrate P. As disclosed in International Publication No. 2001/035168, the present invention is also applicable to the exposure apparatus (lithography system) in which a line-and-space pattern is formed on the substrate P by forming interference fringes on the substrate P. It is also possible to dispense with the projection optical system for projecting the image of the pattern onto the substrate P.

As for the exposure apparatus EX, the present invention is also applicable to the exposure apparatus based on the system in which the full field exposure is performed on the substrate P by using a projection optical system (for example, the dioptric type projection optical system having a reduction magnification of 1/8 and including no catoptric element) with a reduction image of a first pattern in a state in which the first pattern and the substrate P are allowed to substantially stand still. In this case, the present invention is also applicable to the full field exposure apparatus based on the stitch system in which the full field exposure is further performed thereafter on the substrate P by partially overlaying a reduction image of a second pattern with respect to the first pattern by using the projection optical system in a state in which the second pattern and the substrate P are allowed to substantially stand still. As for the exposure apparatus based on the stitch system, the present invention is also applicable to the exposure apparatus based on the step-and-stitch system in which at least two patterns are partially overlaid and transferred on the substrate P, and the substrate P is successively moved.

The present invention is also applicable to the twin-stage type exposure apparatus. The structure and the exposure operation of the twin-stage type exposure apparatus are disclosed, for example, in Japanese Patent Application Laid-open Nos. 10-163099 and 10-214783 (corresponding to U.S. Pat. Nos. 6,341,007, 6,400,441, 6,549,269, and 6,590,634), Japanese Patent Application Laid-open No. 2000-505958 (PCT) (corresponding to U.S. Pat. No. 5,969,441), and U.S. Pat. No. 6,208,407. The disclosures thereof are incorporated herein by reference within a range of permission of the domestic laws and ordinances of the state designated or selected in this international application.

In the embodiment described above, the exposure apparatus, in which the space between the projection optical system PL and the substrate P is locally filled with the liquid, is adopted. However, the present invention is also applicable to such a liquid immersion exposure apparatus that a stage, which supports the substrate as the exposure objective, is moved in a liquid bath, as disclosed, for example, in Japanese Patent Application Laid-open Nos. 6-124873 and 10-303114. The structure and the exposure operation of such a liquid immersion exposure apparatus are described in detail, for example, in U.S. Pat. No. 5,825,043. The contents of the description in this United States patent document are incorporated herein by reference within a range of permission of the domestic laws and ordinances of the state designated or selected in this international application.

As for the type of the exposure apparatus EX, the present invention is not limited to the exposure apparatus for the semiconductor device production for exposing the substrate P with the semiconductor device pattern. The present invention is also widely applicable, for example, to the exposure apparatus for producing the liquid crystal display device or for producing the display as well as the exposure apparatus for producing, for example, the thin film magnetic head, the imaging device (CCD), the reticle, or the mask.

When the linear motor is used for the substrate stage PST and/or the mask stage MST, it is allowable to use any one of those of the air floating type based on the use of the air bearing and those of the magnetic floating type based on the use of the Lorentz's force or the reactance force. Each of the stages PST, MST may be either of the type in which the movement is effected along the guide or of the guideless type in which no guide is provided. An example of the use of the linear motor for the stage is disclosed in U.S. Pat. Nos. 5,623,853 and 5,528,118. The contents of the descriptions in the literatures are incorporated herein by reference respectively within a range of permission of the domestic laws and ordinances of the state designated or selected in this international application.

As for the driving mechanism for each of the stages PST, MST, it is also allowable to use a plane motor in which a magnet unit provided with two-dimensionally arranged magnets and an armature unit provided with two-dimensionally arranged coils are opposed to one another, and each of the stages PST, MST is driven by means of the electromagnetic force. In this arrangement, any one of the magnet unit and the armature unit is connected to the stage PST, MST, and the other of the magnet unit and the armature unit is provided on the side of the movable surface of the stage PST, MST.

The reaction force, which is generated in accordance with the movement of the substrate stage PST, may be mechanically released to the floor (ground) by using a frame member so that the reaction force is not transmitted to the projection optical system PL, as described in Japanese Patent Application Laid-open No. 8-166475 (U.S. Pat. No. 5,528,118). The contents of the descriptions in U.S. Pat. No. 5,528,118 are incorporated herein by reference within a range of permission of the domestic laws and ordinances of the state designated or selected in this international application.

The reaction force, which is generated in accordance with the movement of the mask stage MST, may be mechanically released to the floor (ground) by using a frame member so that the reaction force is not transmitted to the projection optical system PL, as described in Japanese Patent Application Laid-open No. 8-330224 (U.S. Pat. No. 5,874,820). The disclosure of U.S. Pat. No. 5,874,820 is incorporated herein by reference within a range of permission of the domestic laws and ordinances of the state designated or selected in this international application.

As described above, the exposure apparatus EX according to the embodiment of the present invention is produced by assembling the various subsystems including the respective constitutive elements as defined in claims so that the predetermined mechanical accuracy, the electric accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 8:
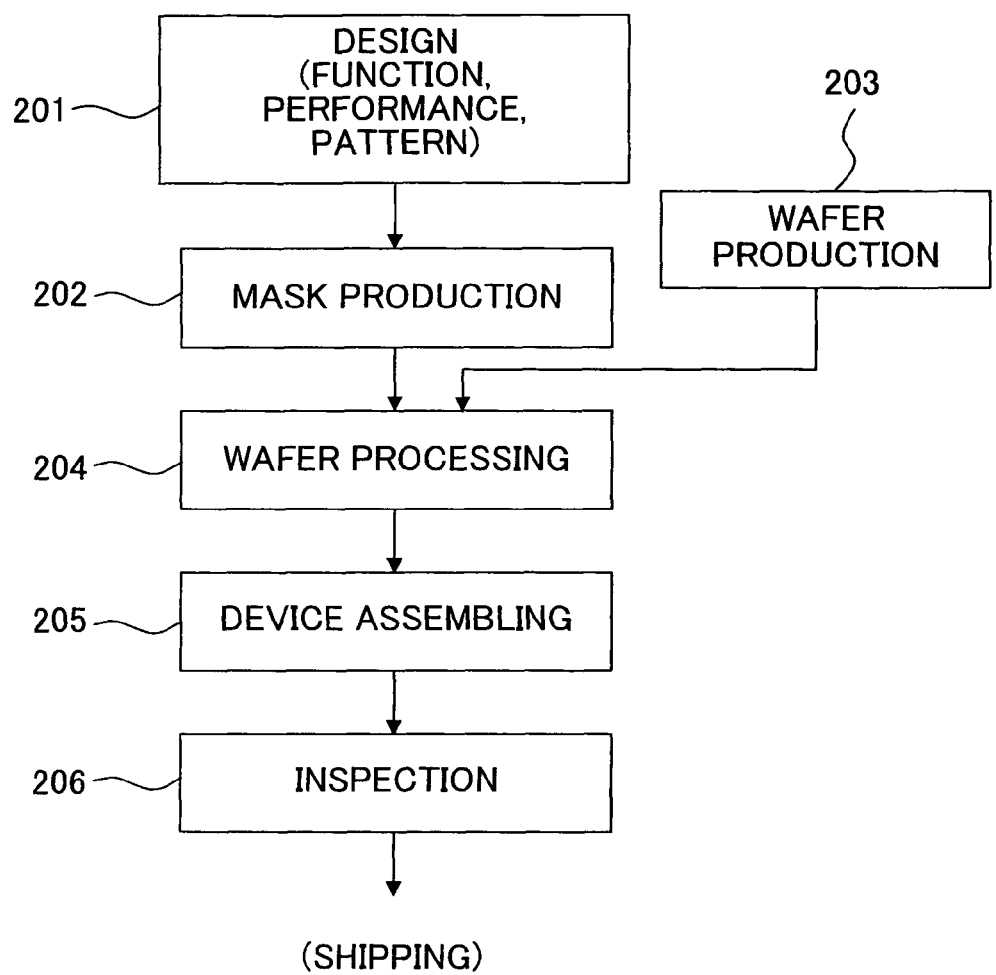
FIG. 8 shows a flow chart illustrating exemplary steps of producing a semiconductor device.

As shown in FIG. 8, the microdevice such as the semiconductor device is manufactured by performing, for example, a step 201 of designing the function and the performance of the microdevice, a step 202 of manufacturing a mask (reticle) based on the designing step, a step 203 of producing a substrate (wafer) as a base material for the device, an exposure process (wafer processing) step 204 of exposing the substrate with a pattern of the mask by using the exposure apparatus EX of the embodiment described above, a step of assembling the device (including a dicing step, a bonding step, and a packaging step) 205, and an inspection step 206. The wafer processing step 204 includes Steps SA1 to SA9 explained with reference to the flow chart shown in FIG. 3.

INDUSTRIAL APPLICABILITY

According to the present invention, it is possible to optimize the projection state of the pattern image in the presence of the liquid immersion area. Therefore, it is possible to provide the device having the device pattern of the high resolution by means of the liquid immersion exposure.

The invention claimed is:

1. A method for determining an exposure condition to expose a substrate by projecting a pattern image onto the substrate via a projection optical system and a liquid retained between the projection optical system and the substrate, the method for determining the exposure condition comprising:
successively projecting the pattern image via the projection optical system and the liquid under a plurality of conditions of the liquid and determining a plurality of correction amounts of an optical characteristic of the projection optical system under the plurality of conditions of the liquid, respectively, before exposing the substrate;
setting a condition of the liquid, among the plurality of conditions of the liquid, which is used when the pattern image is projected on the substrate; and
determining a correction amount, among the plurality of correction amounts of the optical characteristic of the projection optical system, corresponding to the set condition of the liquid.

2. The method for determining the exposure condition according to claim 1, wherein the optical characteristic of the projection optical system includes a spherical aberration.

3. The method for determining the exposure condition according to claim 2, further comprising:
successively projecting the pattern image onto different positions on a test substrate while changing the condition of the liquid, wherein:
the measurement of projection states includes measurement of projection states of a plurality of pattern images formed on the test substrate.

4. The method for determining the exposure condition according to claim 3, wherein the measurement of projection states includes measurement of shapes of the pattern images formed on the test substrate.

5. The method for determining the exposure condition according to claim 3, wherein the pattern image is successively projected while changing a spherical aberration of the projection optical system under a first condition and a second condition of the liquid respectively.

6. The method for determining the exposure condition according to claim 3, wherein the pattern image is successively projected while changing a positional relationship between an image plane which is formed by the projection optical system and a projection plane on which the pattern image is projected, under a first condition and a second condition of the liquid respectively.

7. The method for determining the exposure condition according to claim 2, wherein the measurement of projection states includes photoelectric detection of the pattern images successively projected while changing the condition of the liquid, via a light-receiving section arranged on an image plane side of the projection optical system.

8. The method for determining the exposure condition according to claim 1, wherein the optical characteristic of the projection optical system includes a focus position.

9. The method for determining the exposure condition according to claim 1, wherein the condition of the liquid includes a temperature condition of the liquid.

10. The method for determining the exposure condition according to claim 1, further comprising:
performing measurement of projection states of a plurality of pattern images successively projected while changing the condition of the liquid, wherein:
the condition of the liquid and the correction amount of the optical characteristic of the projection optical system are determined on the basis of the measured projection states of the pattern images.

11. The method for determining the exposure condition according to claim 1, further comprising:
successively projecting the pattern image while changing the optical characteristic of the projection optical system under a first condition of the liquid;
successively projecting the pattern image while changing the optical characteristic of the projection optical system under a second condition of the liquid; and
determining the condition of the liquid and the correction amount of the optical characteristic of the projection optical system on the basis of a plurality of pattern images projected under the first condition and a plurality of pattern images projected under the second condition.

12. The method for determining the exposure condition according to claim 1, further comprising:
successively projecting the pattern image onto a projection plane while changing a positional relationship between an image plane which is formed by the projection optical system and the projection plane on which the pattern image is projected, under a first condition of the liquid;
successively projecting the pattern image onto the projection plane while changing the positional relationship between the image plane which is formed by the projection optical system and the projection plane on which the pattern image is projected, under a second condition of the liquid; and
determining the condition of the liquid and the correction amount of the optical characteristic of the projection optical system on the basis of a plurality of pattern images projected under the first condition and a plurality of pattern images projected under the second condition.

13. An exposure method comprising exposing a substrate via a liquid set to have a condition which is determined by the method as defined in claim 1 and the projection optical system of which optical characteristic is corrected by the method as defined in claim 1.

14. A method for manufacturing a device, comprising using the exposure method as defined in claim 13.

15. The method for determining the exposure condition according to claim 1, further comprising performing at least a positional adjustment of an optical element of the projection optical system based on the determined correction amount.

16. The method for determining the exposure condition according to claim 1, wherein the optical characteristic of the projection optical system includes a positional relationship between the substrate and an image plane to be formed via the projection optical system and the liquid.

* * * * *